(12) United States Patent
Matsuo et al.

(10) Patent No.: US 9,437,702 B2
(45) Date of Patent: Sep. 6, 2016

(54) ELECTRONIC COMPONENT MANUFACTURING METHOD AND ELECTRODE STRUCTURE

(71) Applicant: CANON ANELVA CORPORATION, Kawasaki-shi (JP)

(72) Inventors: Akira Matsuo, Kawasaki (JP); Yohsuke Shibuya, Kawasaki (JP); Naomu Kitano, Kawasaki (JP); Eitaroh Morimoto, Kawasaki (JP); Koji Yamazaki, Kawasaki (JP); Yu Sato, Kawasaki (JP); Takuya Seino, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 0 days.

(21) Appl. No.: 14/327,985

(22) Filed: Jul. 10, 2014

(65) Prior Publication Data
US 2014/0319676 A1     Oct. 30, 2014

Related U.S. Application Data

(63) Continuation of application No. PCT/JP2012/006104, filed on Sep. 25, 2012.

(30) Foreign Application Priority Data

Jan. 24, 2012 (JP) .................. 2012-012240

(51) Int. Cl.
*H01L 29/41* (2006.01)
*H01L 21/28* (2006.01)
(Continued)

(52) U.S. Cl.
CPC ......... *H01L 29/4966* (2013.01); *C23C 14/046* (2013.01); *C23C 14/345* (2013.01);
(Continued)

(58) Field of Classification Search
None
See application file for complete search history.

(56) References Cited

U.S. PATENT DOCUMENTS 5,962,923 A    10/1999  Xu et al.
6,045,666 A    4/2000   Xu et al.
(Continued)

FOREIGN PATENT DOCUMENTS

JP    62-283625 A    12/1987
JP    4-354336 A     12/1992
(Continued)

OTHER PUBLICATIONS

Notification of Refusal Reason in Japanese Application No. 2013-555003 (mailed Apr. 21, 2015).
(Continued)

*Primary Examiner* — Asok K Sarkar
(74) *Attorney, Agent, or Firm* — Fitzpatrick, Cella, Harper & Scinto

(57) ABSTRACT

It is an object of the present invention to provide an electronic component manufacturing method, capable of suppressing reduction in a trench opening and suppressing diffusion of a metal film embedded in a trench. An embodiment of the present invention is an electronic component manufacturing method, including the steps of: forming a first electrode constituting layer (e.g., a TiAl film) in a recess (e.g., a trench) formed in a workpiece; forming an ultrathin barrier layer (e.g., a TiAlN film) by forming a nitride layer by plasma-nitriding a surface of the first electrode constituting layer; and forming a second electrode constituting layer (e.g., an Al wiring layer) on the ultrathin barrier layer.

16 Claims, 16 Drawing Sheets

(51) Int. Cl.
    *H01L 21/321*     (2006.01)
    *H01L 21/3205*    (2006.01)
    *H01L 29/49*      (2006.01)
    *C23C 14/35*      (2006.01)
    *H01L 21/8238*    (2006.01)
    *C23C 14/04*      (2006.01)
    *C23C 14/34*      (2006.01)
    *C23C 14/58*      (2006.01)
    *H01J 37/34*      (2006.01)
    *H01L 29/66*      (2006.01)
    *H01L 21/285*     (2006.01)
    *H01L 21/768*     (2006.01)

(52) U.S. Cl.
    CPC ............ *C23C 14/35* (2013.01); *C23C 14/586* (2013.01); *C23C 14/5826* (2013.01); *H01J 37/3402* (2013.01); *H01J 37/3447* (2013.01); *H01J 37/3452* (2013.01); *H01L 21/28088* (2013.01); *H01L 21/321* (2013.01); *H01L 21/32051* (2013.01); *H01L 21/823842* (2013.01); *H01L 21/2855* (2013.01); *H01L 21/76843* (2013.01); *H01L 21/76856* (2013.01); *H01L 29/66545* (2013.01)

(56)         References Cited

U.S. PATENT DOCUMENTS

| 6,136,095 | A   | 10/2000 | Xu et al. |
| 6,216,632 | B1  | 4/2001  | Wickramanayaka |
| 6,217,721 | B1  | 4/2001  | Xu et al. |
| 6,238,533 | B1  | 5/2001  | Satitpunwaycha et al. |
| 6,313,027 | B1  | 11/2001 | Xu et al. |
| 6,461,483 | B1  | 10/2002 | Gopalraja et al. |
| 6,586,288 | B2  | 7/2003  | Kim et al. |
| 8,324,608 | B2  | 12/2012 | Nakagawa et al. |
| 8,440,558 | B2  | 5/2013  | Yin et al. |
| 8,835,296 | B2  | 9/2014  | Wakayanagi et al. |
| 2002/0089027 | A1 | 7/2002 | Xu et al. |
| 2003/0024478 | A1* | 2/2003 | Egami ............... H01J 37/32623 118/723 MA |
| 2012/0161322 | A1 | 6/2012 | Wakayanagi et al. |
| 2013/0049141 | A1* | 2/2013 | Cheng ................. H01L 29/4966 257/412 |

FOREIGN PATENT DOCUMENTS

| JP | 5-343401    | A  | 12/1993 |
| JP | 7-006998    | A  | 1/1995  |
| JP | 11-283926   | A  | 10/1999 |
| JP | 3193875     | B2 | 7/2001  |
| JP | 2002-198441 | A  | 7/2002  |
| JP | 2002-313785 | A  | 10/2002 |
| JP | 2004-506090 | A  | 2/2004  |
| JP | 2007-295004 | A  | 11/2007 |
| JP | 2009-267180 | A  | 11/2009 |
| JP | 2011-153374 | A  | 8/2011  |
| WO | 2011/081202 | A1 | 7/2011  |
| WO | 2011/124001 | A1 | 10/2011 |

OTHER PUBLICATIONS

International Preliminary Report on Patentability (Chapter II) in International Application No. PCT/JP2012/006104 (dated May 2014).

International Search Report in PCT/JP2012/006104 (dated Dec. 25, 2012).

* cited by examiner

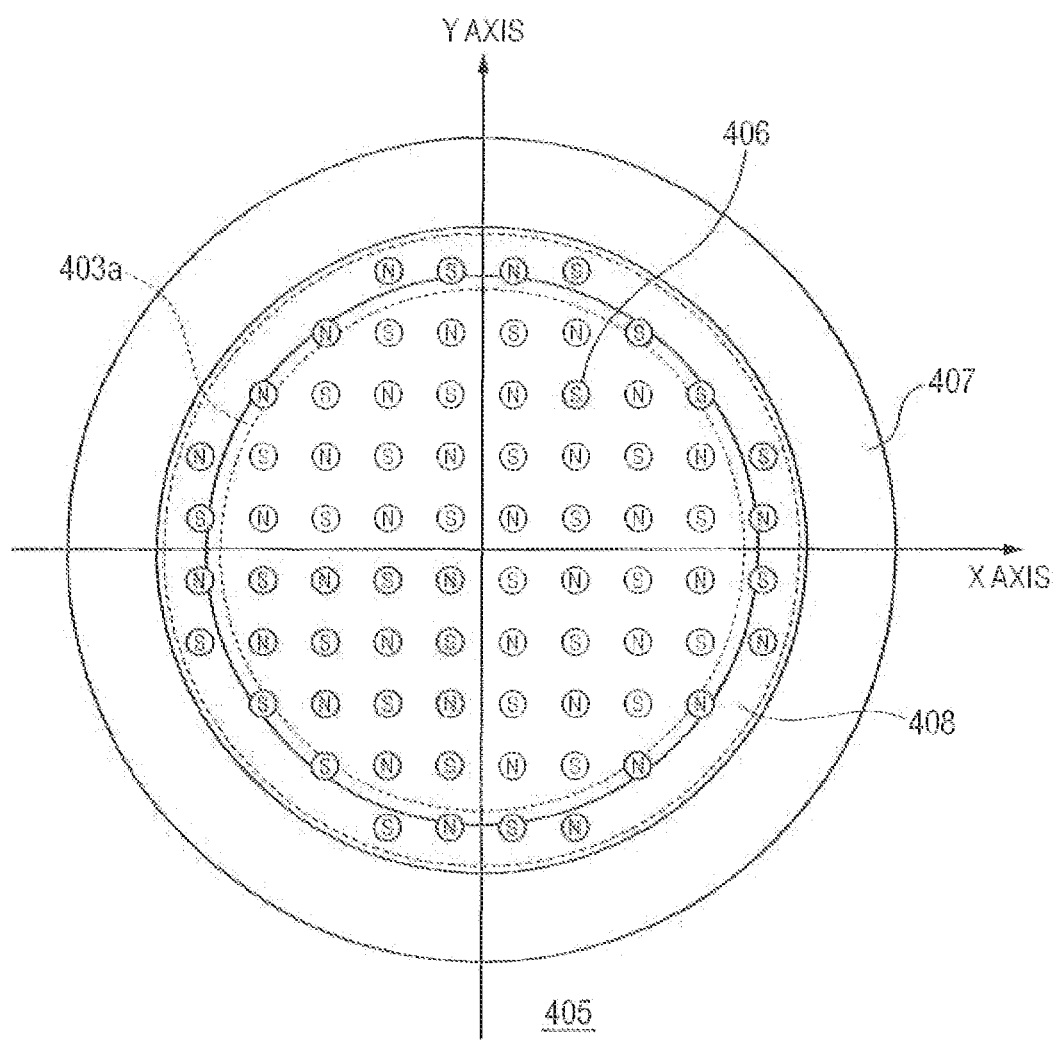

TRENCH WITH
32 nm OPENING

TRENCH WITH
15 nm OPENING

FORMATION TECHNIQUE BY
CONVENTIONAL CVD METHOD

TRENCH WITH
32 nm OPENING

TRENCH WITH
15 nm OPENING

FORMATION TECHNIQUE BY PCM
SPUTTERING OF PRESENT INVENTION

CONVENTIONAL Al EMBEDDING STEP

Al EMBEDDING STEP OF PRESENT INVENTION

CONVENTIONAL STRUCTURE

STRUCTURE OF PRESENT INVENTION

N-TYPE MOSFET    P-TYPE MOSFET

N-TYPE MOSFET    P-TYPE MOSFET

N-TYPE MOSFET    P-TYPE MOSFET

ELECTRONIC COMPONENT MANUFACTURING METHOD AND ELECTRODE STRUCTURE

CROSS-REFERENCES TO RELATED APPLICATIONS

This application is a continuation application of International Application No. PCT/JP2012/006104, filed Sep. 25, 2012, which claims the benefit of Japanese Patent Application No. 2012-012240, filed Jan. 24, 2012. The contents of the aforementioned applications are incorporated herein by reference in their entireties.

TECHNICAL FIELD

The present invention relates to an electronic component manufacturing method and an electrode structure, and more particularly relates to an electronic component manufacturing method and an electrode structure, the method including a step of embedding a metal film in a recess formed in a workpiece.

BACKGROUND ART

For conventional semiconductor integrated circuits, a gate-first method has been used in which a gate insulating film and a gate electrode are formed first on a wafer surface, and then processing by etching is performed. In recent years, thinning of a gate insulating film in a MOSFET has been advanced with element downscaling. When a $SiO_2$ film is used as the gate insulating film, a tunnel current is generated when a film thickness is 2 nm or less, which is a recent demanded value, and thus a gate leak current is increased. To address this, it has recently been considered to replace a gate insulating film material with a high-dielectric material having a relative dielectric constant higher than that of the $SiO_2$ film. Such a method can reduce a $SiO_2$ equivalent thickness (EOT: Equivalent Oxide Thickness) even if an actual insulating film thickness is increased. There is a demand to further reduce the EOT required for a MOSFET having a gate length of 22 nm or less. To satisfy the demand, the actual insulating film thickness needs to be increased by using a high-dielectric material, and thereby the gate leak current needs to be reduced. However, in the gate-first method, a source/drain formation step is performed after gate formation. Thus, the gate insulating film and the gate electrode are heated, and heating of the insulating film and metal film causes diffusion. This leads to a problem such as deterioration in Mobility and a shift in an operating voltage (Vt). In order to solve such problems, a gate-last method has been intensively studied and developed, in which source/drain formation is first performed and a gate insulating film and a gate electrode are formed at the end. In this method, since the gate section is formed at the end, it is considered that a heating temperature in the gate section can be lowered and that deterioration in Mobility and a shift in an operating voltage (Vt) can be suppressed, which are the problems in the gate-first method. What should be achieved by the gate-last method are to form various metal thin films on a shape having an opening of 15 nm or less and a depth of 30 nm or more (hereinafter referred to as a trench) and to control a material deposited on a sidewall or bottom of the trench to have a desired thickness. Moreover, since various metal thin films are laminated, interdiffusion between the metal thin films needs to be suppressed.

In the gate-last method, examples of the method for forming the various metal thin film materials include a CVD (Chemical Vapor Deposition) method, an atomic layer adsorption deposition method and a sputtering method. The CVD method has problems of film thickness controllability, in-plane uniformity and reproducibility since there is incubation time in a formation process. The atomic layer adsorption deposition method is excellent in film thickness controllability but has a cost problem since growth time is increased in the case of forming a thick film and an expensive raw material gas is used. In these methods using chemical reaction of raw material gases, a film can be evenly formed not only on the bottom of the trench but also on a sidewall thereof. On the other hand, an increase in deposition thickness narrows the trench opening. As one of the means for solving such problems, there has been proposed a method for forming various metal thin film materials by a sputtering method excellent in film thickness controllability, in-plane uniformity and reproducibility.

Patent Document 1, for example, discloses an apparatus capable of forming a film also on a sidewall of a trench by a sputtering method under a high pressure of 1 Torr or more, as similar to the CVD method. In this method, directionality of sputtering ions relative to a wafer surface is suppressed by sputtering under high pressure. Thus, film formation can be performed also on the sidewall of the trench. Patent Document 2 discloses a technique and an apparatus to form Ti and TiN laminated barrier underlayers using the sputtering method, then form a Seed-Al layer for facilitating migration of an Al film, and then embed Al through high-temperature migration. In this method, Al can be embedded in the trench while Al diffusion is suppressed with the Ti and TiN laminated barrier underlayers.

Patent Document 3 discloses an electronic component manufacturing method for embedding a low-melting-point-metal in a recess with excellent throwing power by forming barrier layers having sufficient barrier properties and wettability and by preventing or reducing aggregation of the low-melting-point metal deposited at high temperature. This method includes steps of: forming a first barrier layer made of TiNx on the workpiece by plasma treatment while applying a first bias power to an electrode in contact with a workpiece; forming a second barrier layer made of TiNx on the first barrier layer by plasma treatment while applying or without applying a second bias power to an electrode, the second bias power providing ion injection energy smaller than the first bias power; and embedding the low-melting-point metal on the second barrier layer.

Patent Document 4 discloses an electronic component manufacturing method for enabling embedding of Al without reducing an opening diameter even in a minute trench having an opening diameter of 22 nm or less. This method includes: a first step by sputtering while a magnetic field is formed on a target surface by a magnet unit having multiple magnets disposed at grid points of a polygonal grid, the magnets being disposed such that adjacent magnets have opposite poles, the first step forming a barrier layer containing titanium nitride on a workpiece having a recess formed therein, and a second step embedding a low-melting-point metal layer directly on the barrier layer under a temperature condition that allows the low-melting-point metal layer to flow.

As described above, in film formation into a recent minute pattern, the trench opening diameter is reduced by lamination of various metal thin films. To address this, a metal thin film formation technique is required, which can minimize reduction in the opening diameter even when various metal thin films are laminated. Also, in Al embedding, it has been known that Al diffusion deteriorates properties of a metal film used for a gate electrode section. Thus, an ultrathin film barrier layer formation technique is also required to suppress Al diffusion.

PRIOR ART DOCUMENTS

Patent Documents

Patent Document 1: Japanese Unexamined Patent Application Publication No. 2004-506090
Patent Document 2: Japanese Patent No. 3193875
Patent Document 3: WO 2011/081202
Patent Document 1: Japanese Patent Application Laid-Open No. 2011-153374

SUMMARY OF INVENTION

However, the above techniques have the following problems, respectively.

The method involving sputtering at a high pressure of 1 Torr or more described in Patent Document 1 has a problem that, even though deposition on the sidewall of the trench can be performed, the trench opening is narrowed when the trench opening is reduced to 15 nm or less. Moreover, the Al embedding method described in Patent Document 2 has a problem that the Ti and TiN laminated barrier film needs to be thickly deposited to suppress Al diffusion. There is also a problem that, since the Seed-Al layer is further formed on the Ti and TiN laminated barrier film to facilitate Al migration, the trench opening is narrowed.

Meanwhile, in the method described in Patent Document 3, a first barrier layer and a second barrier layer need to be formed so that agglomeration of a low-melting-point metal deposited at high temperature can be prevented or reduced and a recess can be filled with the low-melting-point metal with high throwing power. This leads to a problem that the barrier layers are increased in thickness. Meanwhile, the method described in Patent Document 4 enables embedding of Al without reducing the opening diameter even in a minute trench having an opening diameter of 22 mm or less. However, in the method described in Patent Document 4, the Al layer needs to be embedded under a temperature condition that allows the layer to flow. In the case of a minute trench having an opening diameter of 15 nm or less, there is a concern that unevenness on the surface of the Al film may affect the performance of electronic components.

The present invention was made in consideration of the foregoing conventional problems. It is an object of the present invention to provide an electronic component manufacturing method, capable of solving the problems described above, suppressing reduction in a trench opening, and suppressing diffusion of a metal film embedded in a trench.

As a result of intensive studies to solve the above problem, the present inventors have completed the present invention by finding out that a second electrode constituting layer (e.g., an Al wiring layer) can be directly embedded smoothly without unevenness on an ultrathin barrier layer (e.g., a TiAlN film) even when there is no Seed-Al layer further formed between the ultrathin barrier layer (e.g., the TiAlN film) and the second electrode constituting layer (e.g., the Al wiring layer) by forming a first electrode constituting layer (e.g., a TiAl film) in a recess (e.g., a trench) formed in a workpiece (a first step), forming the ultrathin barrier layer (e.g., the TiAlN film) by plasma nitriding the surface of the first electrode constituting layer (e.g., the TiAl film) to form a nitrided layer (a second step), and then forming the second electrode constituting layer (e.g., the Al wiring layer) on the ultrathin barrier layer (e.g., the TiAlN film) (a third step).

More specifically, in order to achieve the foregoing object, an aspect of the present invention is an electronic component manufacturing method, including: a first step of forming a first electrode constituting layer in a recess formed in a workpiece; a second step of forming a nitride layer by nitriding a surface of the first electrode constituting layer; and a third step of forming a second electrode constituting layer on the nitride layer.

According to the present invention, metal can be embedded even in a minute trench having an opening diameter of 15 nm or less while suppressing reduction in opening diameter by forming a first electrode constituting layer (e.g., a TiAl film) formed on a workplace (first step) with a recess (e.g., a trench) formed therein, forming an ultrathin barrier layer (e.g., a TiAlN film) by forming a nitride layer by plasma-nitriding a surface of the first electrode constituting layer (e.g., the TiAl film) (second step), and forming a second electrode constituting layer (e.g., on Al wiring layer) on the ultrathin barrier layer (e.g., the TiAlN film) (third step). Therefore, even when the electronic component manufacturing method including the step of embedding a metal film according to the present invention is applied to a method for manufacturing a wiring, a metal film can be embedded while suppressing reduction in an opening diameter of a minute trench having an opening diameter of 15 nm or less. Moreover, in an electrode structure formed by the electronic component manufacturing method according to the present invention, a metal wiring layer is formed flat without unevenness on an ultrathin barrier layer (e.g., a TiAlN film) while suppressing reduction in an opening diameter of a minute trench having an opening diameter of 15 nm or less. Thus, an effect is achieved that embedding performance can be enhanced and the yield of a gate-last device can be improved.

BRIEF DESCRIPTION OF DRAWINGS

FIG. 2 is a layout diagram of a magnet mechanism provided in the apparatus according to the present invention.

DESCRIPTION OF EMBODIMENTS

Embodiment

As a result of intensive studies to solve the above problem, the present inventors have completed the present invention by finding out that a second electrode constituting layer (e.g., an Al wiring layer) can be directly embedded smoothly without unevenness on an ultrathin barrier layer (e.g., a TiAlN film) even when there is no Seed-Al layer further formed between the ultrathin barrier layer (e.g., the TiAlN film) and the second electrode constituting layer (e.g., the Al wiring layer) by forming a first electrode constituting layer (e.g., a TiAl film) in a recess (e.g., a trench) formed in a workpiece (a first step), forming the ultrathin barrier layer (e.g., the TiAlN film) by plasma nitriding the surface of the first electrode constituting layer (e.g., the TiAl film) to form a nitrided layer (a second step), and then forming the second electrode constituting layer (e.g., the Al wiring layer) on the ultrathin barrier layer (e.g., the TiAlN film) (a third step). More specifically, the present inventors have found out an electronic component manufacturing method, which suppresses reduction in a trench opening by forming the ultrathin TiAlN barrier film and embedding Al on the TiAlN film, and includes a step of embedding Al into the trench by using a barrier film capable or suppressing Al diffusion.

With reference to the drawings, an embodiment of the present invention is described in detail below.

Figure 1:
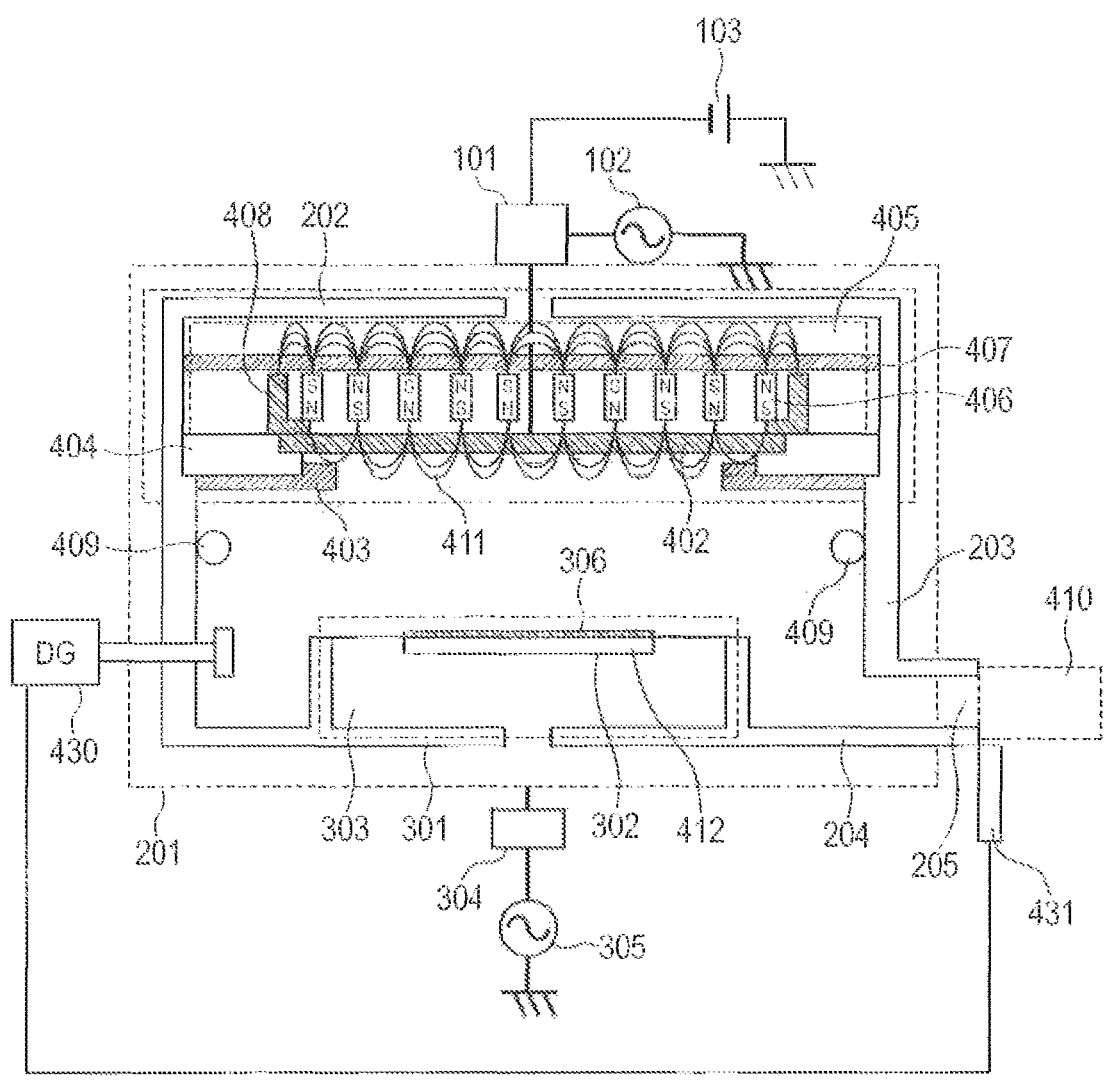
FIG. 1 is a schematic diagram of a PCM sputtering apparatus according to the present invention.

FIG. 1 is a schematic diagram of a PCM sputtering apparatus 100 according to this embodiment. The PCM sputtering apparatus 100 includes a target electrode 402, a chamber 201 and a lower electrode 301 provided facing the target electrode 402. A shield 403 is disposed below the target electrode 402 with a space therebetween. Also, a target electrode insulator 404 is attached to a sidewall of the chamber 201 to hold the target electrode 402. Above the target electrode 402, a magnet mechanism 405 is disposed away from the target electrode 402. The magnet mechanism 405 includes multiple magnet pieces 406, a magnet supporting plate 407 and a magnetic field adjustment magnetic body 408.

Note that, in the present specification, PCM (Point-Cusp Magnetic Field) means formation of a cusp magnetic field closed by four adjacent magnets by using a configuration as shown in FIG. 2 to be described later.

The chamber 201 provided on the atmosphere side of the target electrode 402 includes an upper wall (ceiling wall) 202, a cylindrical sidewall 203 and a bottom wall 204. The target electrode 402 is provided above the chamber 201, and is electrically insulated from the chamber 201 through the target electrode insulator 404. While main parts of the target electrode 402 are made of non-magnetic metal such as Al, SUS and Cu, a target material required for film formation on a substrate 306 is provided on the reduced pressure side of the target electrode 402. FIG. 1 omits illustration of the target material.

A target electrode high-frequency power source 102 supplies high-frequency power to the target electrode 402 through a target electrode matching box 101. Also, a DC power source 103 to apply a direct-current voltage is connected to the target electrode matching box 101. Inside the chamber 201, multiple gas feed ports 409 are provided to supply process gas such as argon into the chamber 201. The chamber 201 is evacuated by a vacuum evacuation pump 410 via a gas exhaust port 205. Moreover, the chamber 201 is also provided with a diaphragm gauge (DG) 430 to measure the pressure inside the chamber 201, and the gas exhaust port 205 is provided with a variable orifice 431 to adjust an exhaust amount according to the pressure.

The lower electrode 301 includes a stage holder 302 and a lower electrode insulator 303. The stage holder 302 is fixed to the bottom wall 204 through the lower electrode insulator 303. The stage holder 302 and the chamber 201 are electrically insulated from each other by the lower-electrode insulator 303. The substrate 306 is placed on an upper surface of the stage holder 302. In addition, a temperature control mechanism 412 can be provided on the lower electrode 301 or the stage holder 302 to control the substrate 306 at a temperature required for film formation. A lower electrode high-frequency power source 305 supplies high-frequency power to the lower electrode 301 through a lower electrode matching box 304.

FIG. 2 is a layout diagram of the magnet mechanism 405 provided in the apparatus according to this embodiment. With reference to FIG. 2, the shape of the magnet mechanism 405 is described in detail. FIG. 2 is a plan view of the magnet mechanism 405 seen from the target electrode 402 side.

As shown in FIG. 2, the multiple magnet pieces 406 and the ring-shaped magnetic field adjustment magnetic body 408 are supported and provided in the disk-shaped magnet support 407. The magnetic field adjustment magnetic body 408 is disposed so as to cover a part of an outer periphery of a region on the target electrode 402 side where the multiple magnet pieces 406 are disposed. Here, in FIG. 3, reference numeral 403a represents an inside diameter of the shield 403, and a number of small circles each represent a shape of the magnet pieces 406. Moreover, the magnet pieces 406 have the same shape and the same magnetic flux density. Furthermore, the letters N and S represent magnetic poles of the magnet pieces 406 seen from the target electrode 402 side.

The magnet pieces 406 are arranged in a grid (an X-axis direction and a Y-axis direction) at approximately the same intervals (5 to 100 mm). Also, the adjacent magnet pieces 406 have poles opposite to each other when seen from the target electrode 402 side. Meanwhile, in a square formed by any four magnet pieces 406 disposed along the X-axis direction and Y-axis direction, the magnet pieces 406 adjacent to each other along a diagonal direction have the same pole seen from the target electrode 402 side. With such arrangement, a point-cusp magnetic field (PCM) 411 is formed using any four adjacent magnet pieces 406.

The height of the magnet pieces 406 is normally larger than 2 mm, and a cross-section thereof has a square or circular shape. The diameter, height and material of the magnet pieces 406 can be appropriately set by a process application. When high-frequency power is supplied to the target electrode 402 in a semiconductor manufacturing apparatus 100, plasma is generated by a capacitively-coupled mechanism. The plasma is subjected to the action of the closed point-cusp magnetic field 411.

The magnetic field adjustment magnetic body 408 is extended so as to partially overlap with the outer periphery of the region on the target electrode 402 side where the magnet pieces 406 are disposed. This can suppress (control) the magnetic field intensity in a gap between the target electrode 402 and the shield 403. The magnetic field adjustment magnetic body 408 may be made of a material capable of controlling the magnetic field intensity in the gap between the target electrode 402 and the shield 403. A high magnetic permeability material such as SUS 430, for example, is preferable. The magnetic field adjustment can be performed by adjusting the area where the magnet pieces 406 and the magnetic field adjustment magnetic body 408 overlap with each other in the magnet mechanism 405. Specifically, adjustment of the area where the magnet pieces 406 and the magnetic field adjustment magnetic body 408 overlap with each other allows a magnetic field, which is required for sputtering of the target electrode 402, to be supplied up to an outermost periphery of the target electrode 402. Thus, the magnetic field intensity can be adjusted in the gap between the target electrode 402 and the shield 403.

Figure 3A:
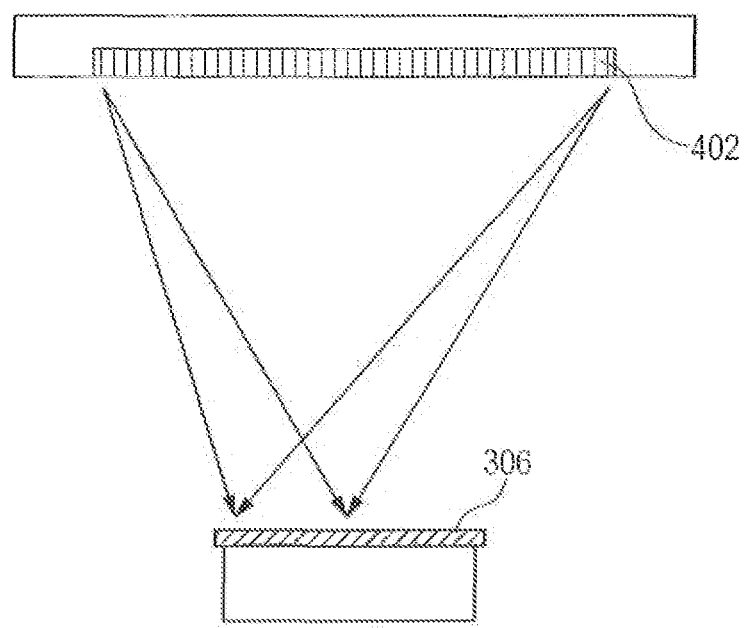
FIG. 3A is an explanatory diagram of a particle transport process in low-pressure sputtering.
Figure 3B:
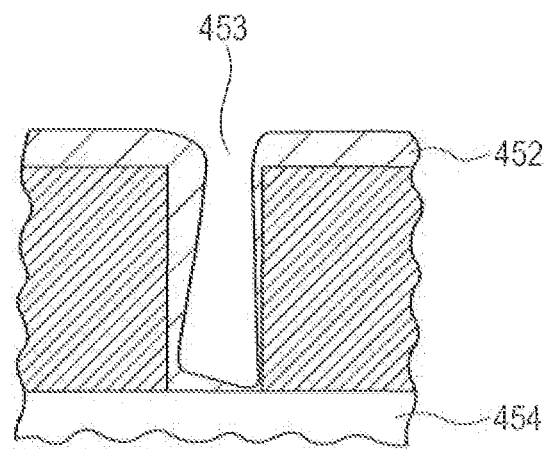
FIG. 3B is an explanatory diagram of the shape of a sputtering film formed in a trench by the low-pressure sputtering.
Figure 3C:
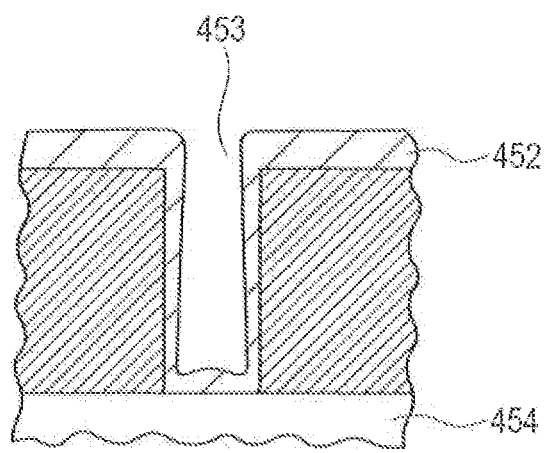
FIG. 3C is an explanatory diagram of the shape of the sputtering film formed in the trench by the low-pressure sputtering.

FIG. 3A is an explanatory diagram of a particle transport process in low-pressure sputtering. As shown in FIG. 3A, in the low-pressure sputtering, sputtering particles do not collide and scatter before reaching the substrate 306 from the target electrode 402. FIG. 3B is an explanatory diagram of the shape of a sputtering film 452 formed in a trench 453 by low-pressure sputtering in a substrate end portion. Meanwhile, FIG. 3C is an explanatory diagram of the shape of the sputtering film 452 formed in the trench 453 by low-pressure sputtering in a substrate center portion. As can be seen from FIGS. 3B and 3C, in the low-pressure sputtering, the shape of the sputtering film 452 is biased in the substrate end portion compared with the substrate center portion. Note that reference numeral 454 denotes a base substrate.

Figure 3D:
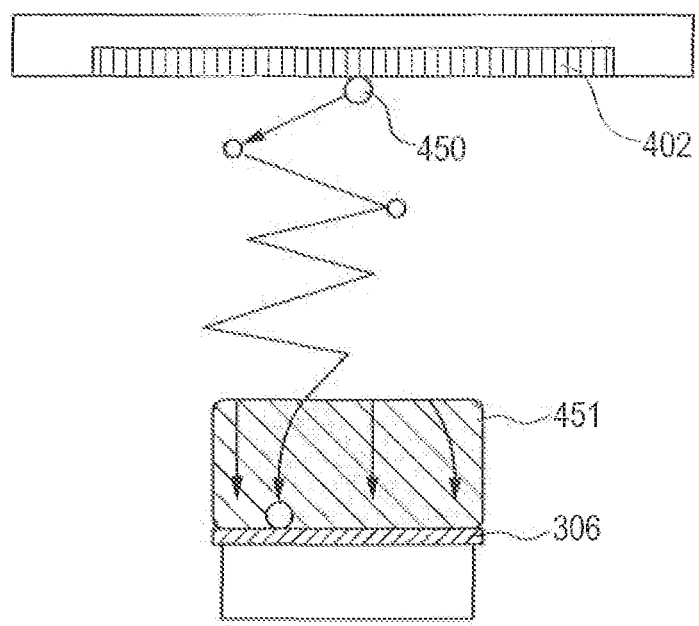
FIG. 3D is an explanatory diagram of a particle transport process in high-pressure sputtering.
Figure 3E:
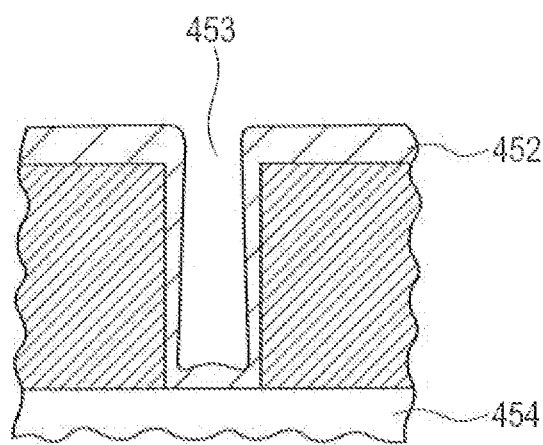
FIG. 3E is an explanatory diagram of the shape of a sputtering film formed in a trench by the high-pressure sputtering.
Figure 3F:
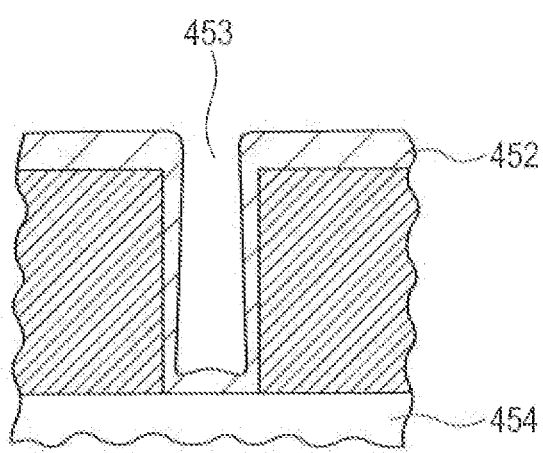
FIG. 3F is an explanatory diagram of the shape of the sputtering film formed in the trench by the high-pressure sputtering.

On the other hand, FIG. 3D is an explanatory diagram of a particle transport process in high-pressure sputtering using the PCM sputtering apparatus 100 shown in FIG. 1 of this embodiment. As shown in FIG. 3D, in the high-pressure sputtering, sputtering particles 450 spread in a container by colliding and scattering before reaching the substrate 306 from the target electrode 402, resulting in sheath acceleration 451 above the substrate 306. Thus, the sputtering particles enter evenly. FIG. 3E is an explanatory diagram of the shape of a sputtering film 452 formed in a trench 453 by high-pressure sputtering in the substrate end portion. Meanwhile, FIG. 3F is an explanatory diagram of the shape of the sputtering film 452 formed in the trench 453 by high-pressure sputtering in the substrate center portion. As can be seen from FIGS. 3E and 3F, the high-pressure sputtering according to this embodiment allows the sputtering film 452 having a symmetrical cover shape to be deposited in the trenches 453 all over the substrate, and can also suppress film formation on the sidewall.

Figure 4:
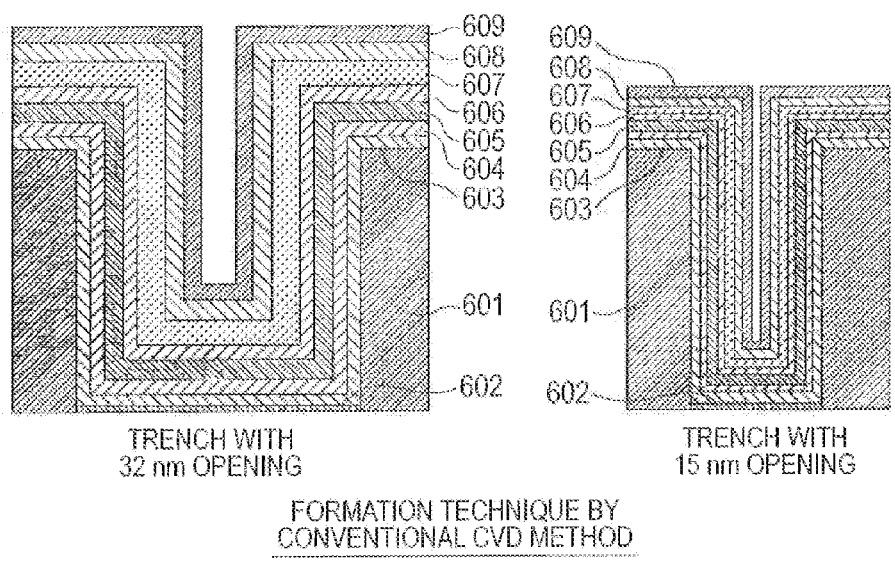
FIG. 4 is a schematic diagram showing trench size dependence in a gate-last method when a conventional CVD method is used for a formation technique.

FIG. 4 is an explanatory diagram of a gate-last formation technique for laminating various materials using a conventional CVD method in minute trench openings having opening diameters of 32 nm and 15 nm, respectively. A minute trench structure 601 includes a base insulating film 602 that is formed beforehand. A high-dielectric insulating film 603 is formed on the base insulating film 602. A metal nitride film A604, a metal nitride film B605, a metal nitride film C606 and a metal film 607 for controlling an operating voltage as well as a barrier film 608 and a Seed-Al film 609 for embedding are formed on the base insulating film 602. When such various materials are formed by the CVD method, films can be formed evenly not only at the bottom of the trench but also on the sidewall. On the other hand, however, it can be understood that increasing the thickness of the films to be formed narrows the trench opening. For this reason, the opening of the minute trench having the opening diameter of 15 nm is closed unless the thickness of each layer is reduced. Therefore, a sufficient film thickness cannot be ensured even when a barrier underlayer needs to be increased in thickness to enhance barrier properties.

Figure 5:
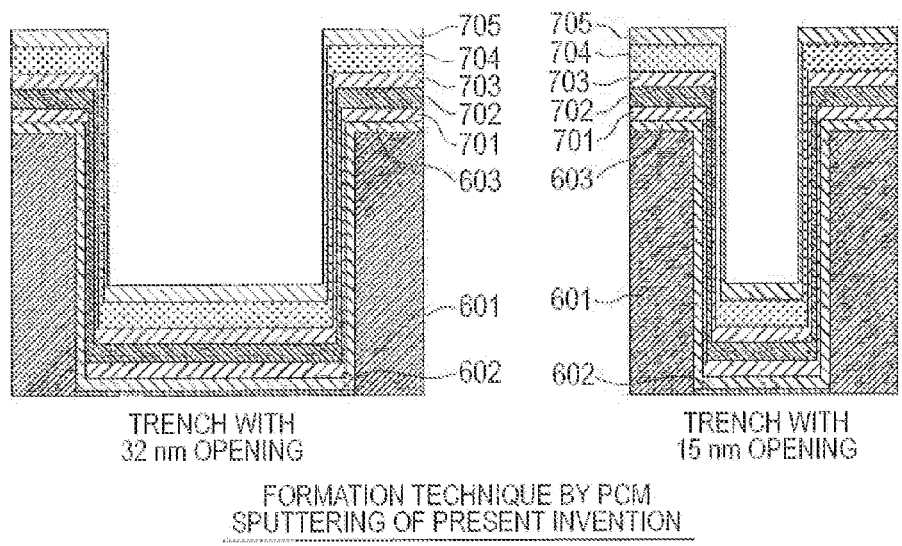
FIG. 5 is a schematic diagram showing trench size dependence in the gate-last method when a PCM sputtering method according to an embodiment of the present invention is used for a formation technique.

Meanwhile, FIG. 5 is an explanatory diagram of a gate-last formation technique for laminating various materials using the PCM sputtering apparatus 100 shown in FIG. 1 according to this embodiment. The base insulating film 602 is formed beforehand at the bottom of the minute trench structure 601. The high-dielectric insulating film (gate insulating film) 603 is formed on the base insulating film 602. A metal nitride film A701, a metal nitride film B702 and a metal nitride film C703 for controlling an operating voltage are formed thereon as a third electrode constituting layer. Furthermore, a metal film (first electrode constituting layer) 704 and a barrier film (nitride layer) 705 for embedding are formed thereon. Since the apparatus of this embodiment can suppress formation of a sputtering film on the sidewall, various materials can be laminated while reduction in the trench opening is suppressed, compared with the CVD method shown in FIG. 4. This enables film formation in a 15 nm minute pattern even with the same film thickness as that of the 32 nm trench. Accordingly, even when the trench size is reduced, the various materials can be laminated without changing the optimized film thicknesses thereof. Furthermore, the barrier film formed using the method of this embodiment is obtained only by plasma nitriding a titanium aluminum single-layer film. Thus, the number of layers in the laminate structure can be reduced.

The above point is further described with reference to FIGS. 1 to 3. In this embodiment, an ultrathin barrier film is formed by forming the point-cusp magnetic field 411 using any four adjacent magnet pieces 406 shown in FIG. 2 and generating a high plasma density (e.g., $1\times10^{11}$/unit volume) in the chamber 201. In the case of the PCM sputtering apparatus 100 shown in FIG. 1 for implementing the method of this embodiment, the plasma density is increased when the pressure in the chamber 201, the power of the target electrode power source 102 or the frequency of the target electrode power source 102 is increased, and is reduced when the pressure in the chamber 201, the power of the target electrode 402 (cathode) or RF frequency of the target electrode 402 (cathode) is lowered. Therefore, compared with a normal sputtering method, the plasma formed in the chamber 201 has a high ionization rate by increasing the frequency of the target electrode power source 102 (e.g., 40 MHz to 60 MHz), increasing the power of the target electrode power source 102 (e.g., 3000 W) and increasing the pressure in the chamber 201 (e.g., 10 Pa). Thus, a TiAl film can be formed evenly at the bottom and sidewall of a step of a trench. Moreover, a nitride layer is formed by plasma nitriding the surface of the TiAl film formed in the trench formed in the workplace by use of the PCM sputtering apparatus 100 shown in FIG. 1. Then, the plasma formed in the chamber 201 has a high ionization rate even under high pressure since 60 MHz is used. Thus, since nitrogen ion energy is suppressed, an ultrathin TiAlN film barrier layer can be formed. Also, a second electrode constituting layer (e.g., an Al wiring layer) can be directly embedded smoothly without unevenness on the ultrathin TiAlN film barrier layer.

Figure 6:
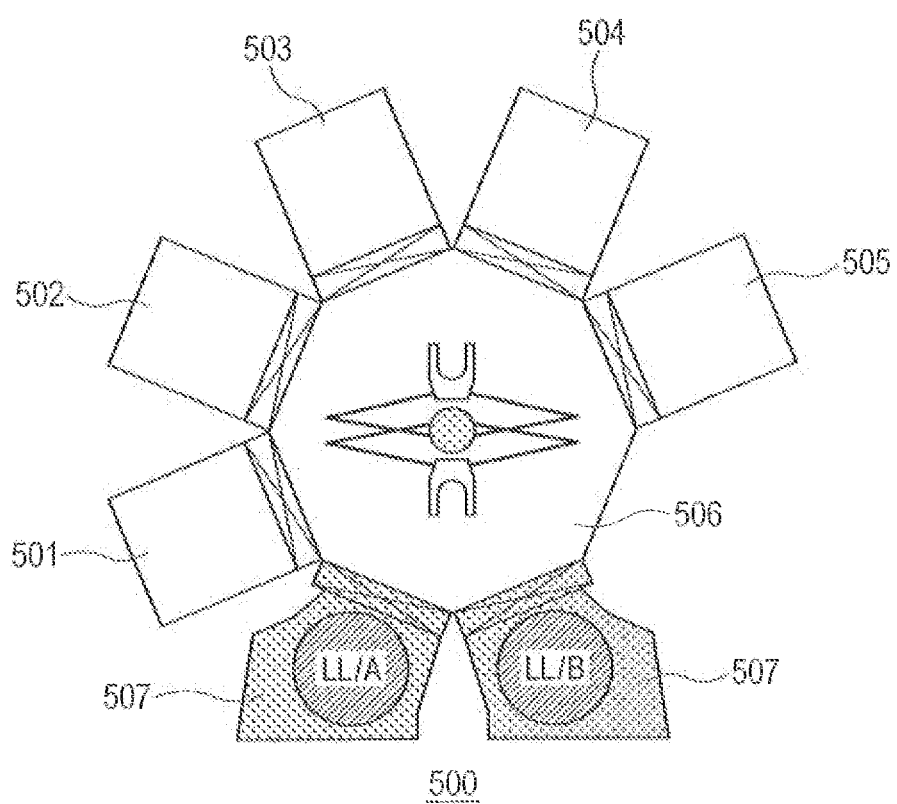
FIG. 6 is a diagram showing a configuration of a semiconductor manufacturing apparatus according to the embodiment of the present invention.

FIG. 6 shows a semiconductor manufacturing apparatus 500 used in an electronic component manufacturing method including a step of embedding a metal film according to this embodiment. The semiconductor manufacturing apparatus 500 includes: a chamber 501 for forming a titanium aluminum film as a first step; a chamber 502 for plasma nitriding the titanium aluminum film as a second step; a chamber 503 for embedding Al as a third step; and chambers 504 and 505 for forming metal films, which are attached to enable film formation of various other metal materials. The apparatus further includes: a transfer chamber 506 equipped with a vacuum transfer unit capable of transferring the substrate to the chambers 501 to 505 without exposing the substrate to the atmosphere; and a load lock chamber 507 for transferring the substrate from the atmosphere into the vacuum. Note that the PCM sputtering apparatus 100 of this embodiment shown in FIG. 1 can be used as the chambers 501 to 505. The use of the semiconductor manufacturing apparatus 500 of this embodiment enables continuous processing without exposing the substrate to the atmosphere. Thus, impurities such as moisture, carbon and oxygen can be prevented from adsorbing onto an interface. Accordingly, the substrate can be transferred to the next step without changing the properties of the films formed in the respective apparatus. Note that the semiconductor manufacturing apparatus 500 includes a controller (not shown) including an arithmetic processing unit such as a CPU, and executes predetermined processing on the substrate to be processed by outputting instruction signals to the respective processing apparatus 501 to 507 according to a predetermined program. Note that each of the chambers 501 to 507 includes a control apparatus (not shown) such as a PLC (programmable logic controller) to control apparatus such as a mass-flow controller and an exhaust pump according to the instruction signals outputted from the controller.

Figure 7A:
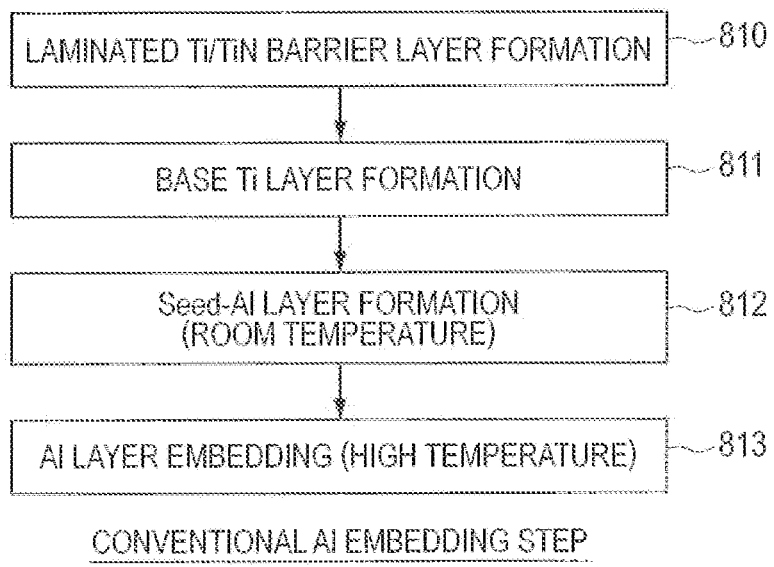
FIG. 7A is a flowchart showing a conventional Al embedding step.
Figure 7B:
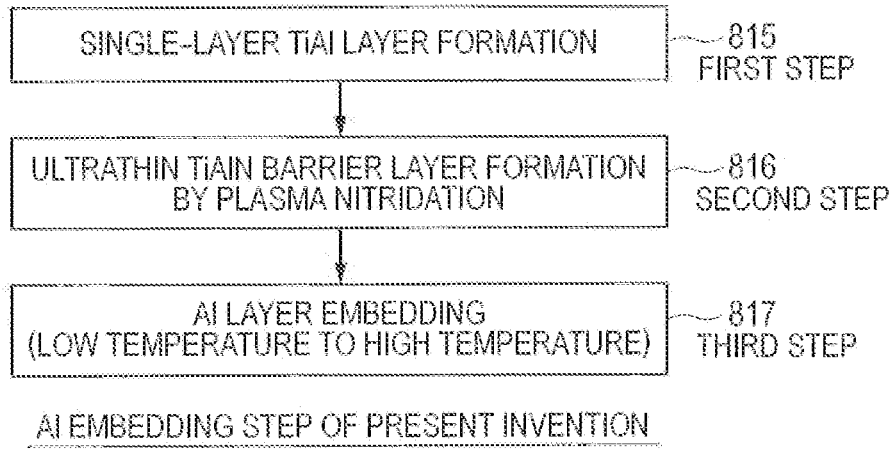
FIG. 7B is a flowchart showing an Al embedding step according to the embodiment of the present invention.

FIG. 7A is a flowchart of an Al embedding step according to the conventional technique (Patent Document 2 described above). FIG. 7B is a flowchart of an Al embedding step according to this embodiment. In the conventional Al embedding step, a laminated barrier film formation step 810 is performed to suppress Al diffusion. Then, a barrier film formation step 811 is performed to prevent Al diffusion on the laminated barrier film. Thereafter, a Seed-Al layer formation step 812 is performed to facilitate Al migration. Subsequently, a high-temperature Al embedding step 813 is performed.

However, the Al embedding step using the apparatus of this embodiment can achieve complete embedding performance even after performing a titanium aluminum film formation step 815 as a first step, performing a titanium-aluminum nitride film formation step 816 as a second step and then directly performing an Al embedding formation step 817 without using Seed-Al. As for deposition of a TiAl single layer film in the first step 815, film formation is performed by using a metal alloy target of TiAl as a target, setting a substrate temperature to 30° C., a target RF power of TiAl to 1500 W and a DC voltage to 430 V, and also by using Ar as an inactive gas, setting an Ar feed rate to 100 sccm, and setting the pressure in the chamber to 10 Pa with an automatic adjuster. Moreover, in order to control the shape of films to be formed, the film formation is performed by setting RF power to 50 W for a substrate electrode.

Next, as for the formation of she titanium-aluminum nitride film in the second step 816, plasma nitridation is performed by setting the substrate temperature to 30° C., a target RF power of Ti to 3000 W, a DC voltage to 0 V, a feed rate of nitrogen as a reactive gas to 100 sccm, and the pressure in the chamber to 10 Pa with the automatic adjuster. By setting the DC voltage to 0 V, a high-density and low-energy nitrogen plasma is generated. Thus, only a surface layer of the titanium aluminum film is plasma-nitrided to form a TiAlN barrier film. Here, the frequency of the high-frequency power source is preferably between 10 MHz and 100 MHz, more preferably between 40 MHz and 60 MHz for high-density plasma formation using a point-cusp magnetic field under the pressure described above.

Next, as for Al deposition in the third step 817, film formation is performed by setting the substrate temperature to 30 to 450° C., a target RF power of Al to 3000 W and the DC voltage to 215 V, and also by using Ar as an inactive gas, setting an Ar feed rate to 100 sccm, and setting the pressure in the chamber to 10 Pa with the automatic adjuster. Also, in order to increase the film thickness at the bottom of the trench, the film formation is performed by setting the RF power to 200 W for the substrate electrode. Here, the frequency of the high-frequency power source is preferably between 10 MHz and 100 MHz, more preferably between 10 MHz and 60 MHz for high-density plasma formation using the point-cusp magnetic field under the pressure described above.

Figure 8A:
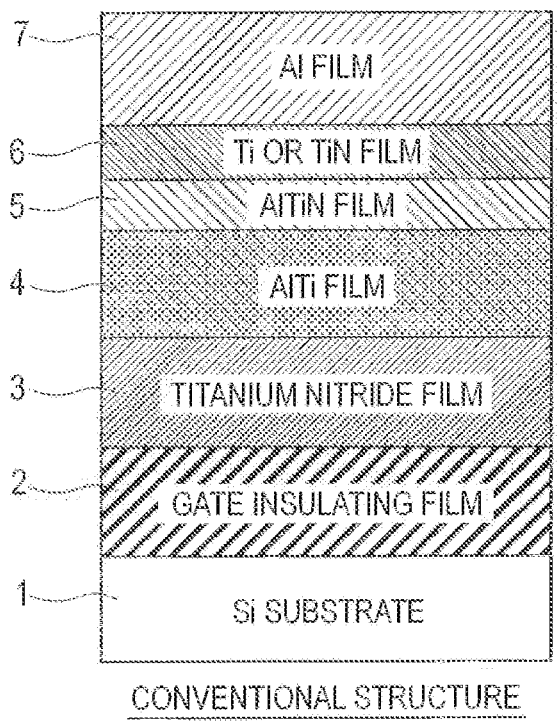
FIG. 8A is a diagram showing a conventional laminated film structure.
Figure 8B:
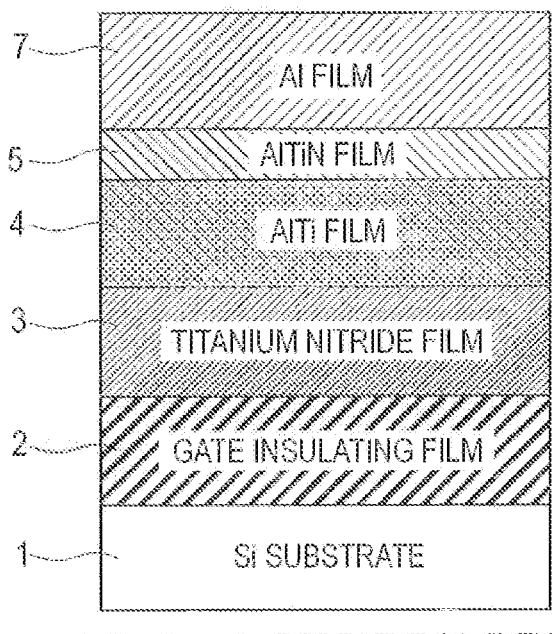
FIG. 8B is a diagram showing a laminated film structure according to the embodiment of the present invention.

FIG. 8A is an explanatory diagram showing a conventional (Patent Document 2) structure. FIG. 8B is an explanatory diagram showing a structure of this embodiment. While the conventional structure includes a Ti or TiN base film 6 on a TiAlN film 5, the structure of this embodiment includes an Al film 7 on a TiAlN film 5 by forming the TiAlN film 5 on a surface of a TiAl film 4 by plasma nitridation without using a Ti or TiN base film. Note that the structure of Patent Document 3 described above is obtained by depositing a first titanium nitride film 3 (first barrier layer) on a gate insulating film 2 and then depositing a second TiN base film (second barrier layer) on the first titanium nitride film 3. Thus, the barrier layers are increased in thickness. On the other hand, the structure of Patent Document 4 is obtained by laminating a titanium nitride film 3 and an Al film 7 on a gate insulating film 2. However, the Al film 7 needs to be deposited under a temperature condition that allows the Al film 7 to flow. Therefore, in the case of a minute trench having an opening diameter of 15 nm or less, unevenness on the surface of the Al film affects the performance of electronic components.

Figure 9:
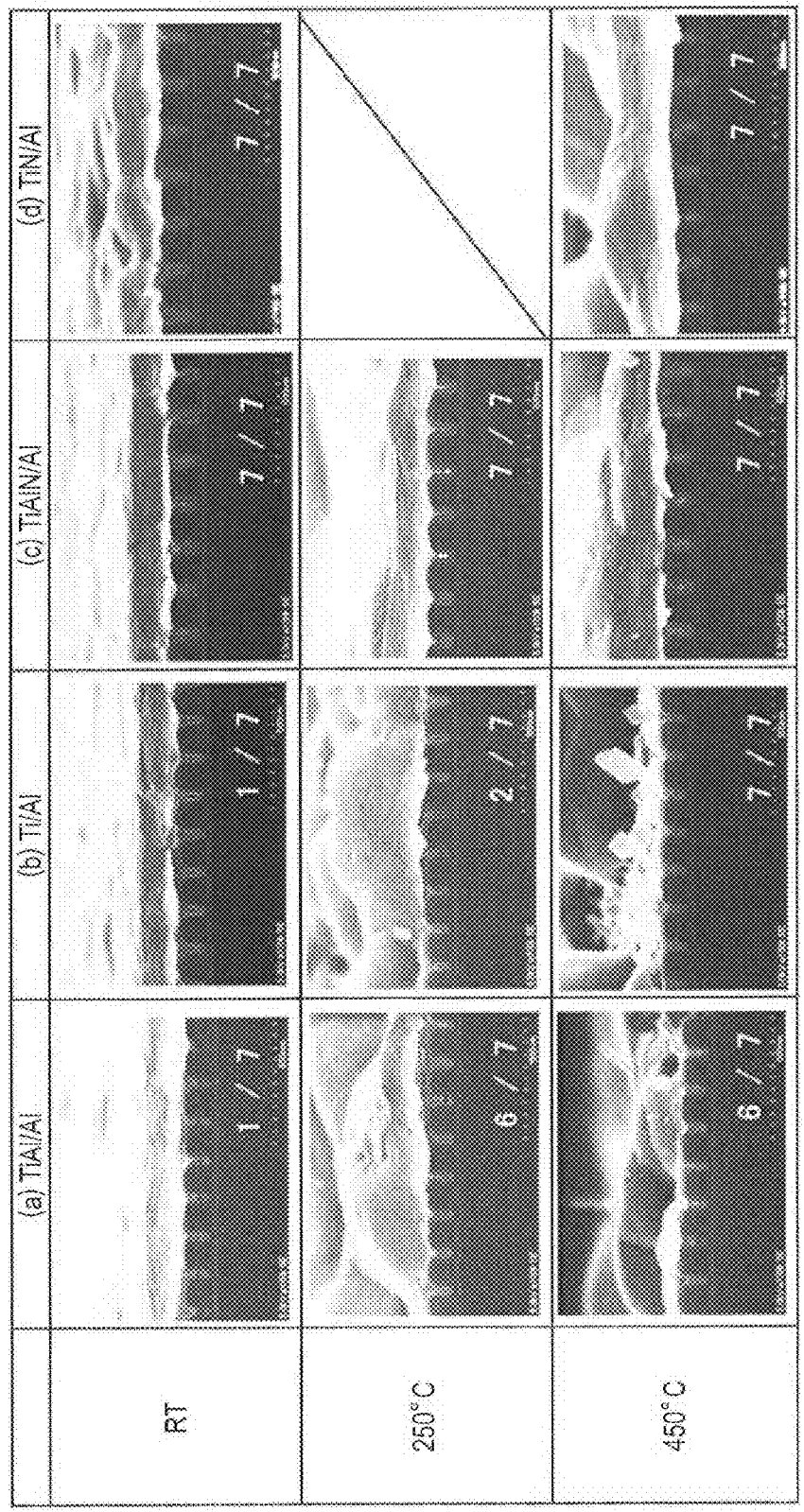
FIG. 9 is a table showing Al embedding characteristics when respective underlayers are used.

FIG. 9 shows results obtained by observing Al embedding properties after forming various underlayers using the PCM sputtering apparatus 100 shown in FIGS. 1 and 6 according to this embodiment. Each of the photographs shown in FIG. 9 is provided with a ratio expressed by X/Y. The denominator (Y) represents the number of trenches observed and the numerator (X) represents the number of trenches completely embedded with Al in the third step. For example, 7/7 shown in the photographs in the case (c) of the TiAlN underlayer (RT) of this embodiment represents complete embedding with seven trenches completely embedded with aluminum out of seven trenches observed. On the other hand, 1/7 shown in the photograph in the case (b) of the TiAlN/Ti laminated underlayer (RT) represents a low embedding rate with one trench completely embedded with aluminum out of seven trenches observed. The Al embedding properties are evaluated by SEM (Secondary Electron Microscopy) analysis.

(a) in FIG. 9 is a result (referred to as the TiAl underlayer) obtained by Al embedding as the third step after the TiAl film is deposited in 10 nm in the first step. (b) in FIG. 9 is a result (referred to as the TiAlN/Ti laminated underlayer) obtained by performing the titanium-aluminum nitride film formation step as the second step after the TiAl film is deposited in 10 nm in the first step and then further forming a Ti film and performing Al embedding as the third step. (c) in FIG. 9 is a result (referred to as the TiAlN underlayer according to this embodiment) obtained by performing the titanium-aluminum nitride film formation step as the second step after the TiAl film is deposited in 10 nm in the first step and then performing Al embedding as the third step. (d) in FIG. 9 is a result (referred to as the TiAlN/TiN laminated underlayer) obtained by performing the titanium-aluminum nitride film formation step as the second step after the TiAl film is deposited in 10 nm in the first step and then further forming a TiN film and performing Al embedding as the third step. Moreover, (a) to (d) are evaluated by setting the temperature of Al embedding as the third step to RT (room temperature), 250° C. and 450° C. (note, however, that the result of 250° C. is omitted in (d)).

In (a) in FIG. 9, while a generation rate of voids (hereinafter referred to as Void) is improved by increasing the Al embedding temperature from room temperature to 250° C. and 450° C., many Voids are observed. In (b) in FIG. 9, a Void generation rate is improved by increasing the Al embedding temperature from room temperature to 250° C., and no Voids are observed by further increasing the temperature to 450° C. On the other hand, in (c) in FIG. 9 according to this embodiment, the Void generation rate is improved even at room temperature, and no Voids are observed by increasing the Al embedding temperature to 250° C. and 450° C. This is considered to be because, in the TiAl underlayer or TiAlN/Ti laminated underlayer, Al embedding causes Ti and Al to react with each other to facilitate alloying, thereby suppressing Al migration. (d) in FIG. 9 shows that, although Al embedding can be performed even at room temperature, flatness is deteriorated compared with the case using the TiAlN underlayer according to this embodiment. Therefore, the results show that the use of the TiAlN single-layer barrier film of this embodiment can suppress alloying and facilitate Al migration, thereby achieving better surface flatness.

Furthermore, in each of (a) to (c), surface aggregation of Al is observed. It is known that a large aggregation deteriorates Al reflectivity and increases a specific resistance value. Also, when planarization is performed by CMP in the next step, uneven Al thickness due to the aggregation causes a problem in element processing. When the TiAlN film of this embodiment is used and particularly when the Al embedding temperature is 250° C., complete Al embedding can be performed and Al aggregation can be suppressed compared with the other base films. This shows that the use of the TiAlN film as the base film facilitates Al migration, thereby achieving a sufficient embedding rate without increasing the Al embedding temperature.

Figure 10A:
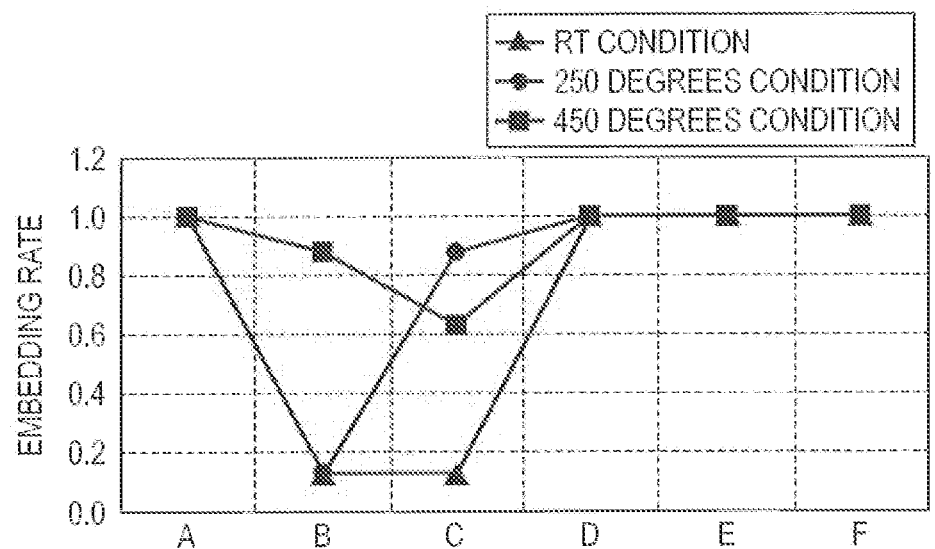
FIG. 10A is a graph showing a relationship between the kind of the underlayer and an embedding rate.
Figure 10B:
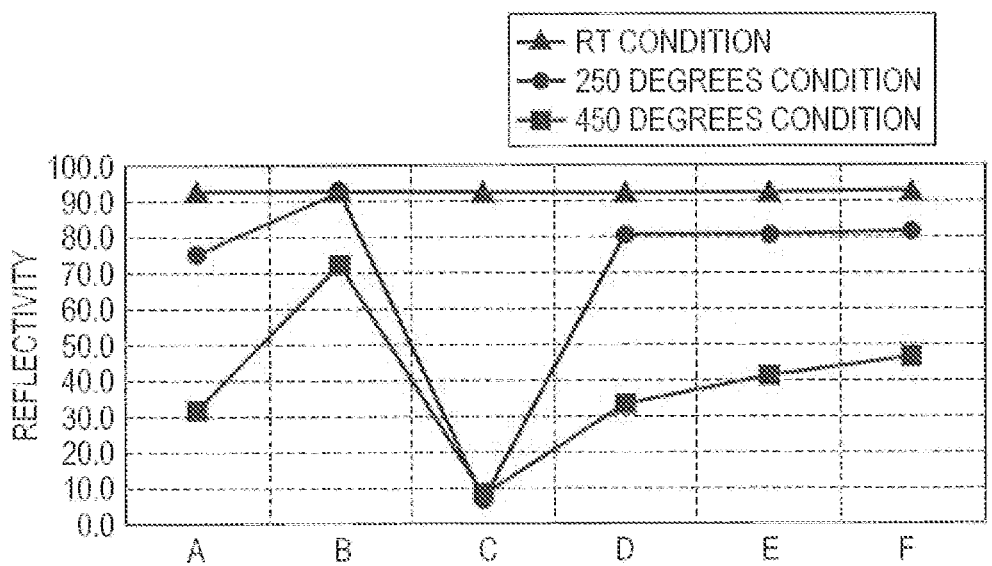
FIG. 10B is a graph showing a relationship between the kind of the underlayer and a reflectivity.
Figure 10C:
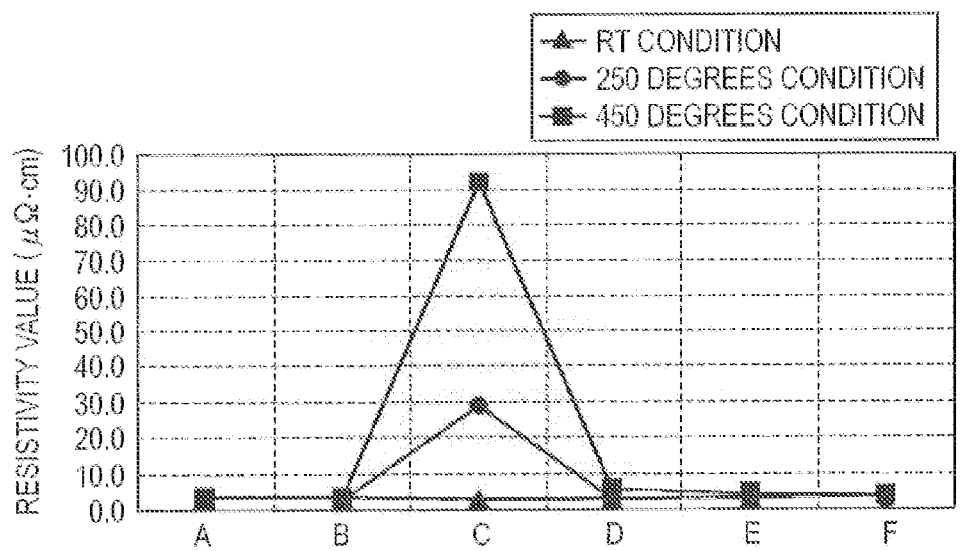
FIG. 10C is a graph showing a relationship between the kind of the underlayer and a specific resistance value.

FIG. 10A is a graph showing embedding rates when using various underlayers. FIG. 10B is a graph showing reflectivity of the Al film when using the various underlayers. FIG. 10C is a graph showing specific resistance values of the Al film when using the various underlayers. Note that FIGS. 10A to 10C show the results obtained by setting the Al embedding temperature to RT (room temperature, i.e., about 20 to 30° C.), 250° C. and 450° C., respectively. The vertical axis in FIG. 10A represents the embedding rate, the vertical axis in FIG. 10B represents the reflectivity, and the vertical axis in FIG. 10C represents the specific resistance value. The horizontal axes in FIGS. 10A to 10C represent the kinds of the underlayer. To be more specific, in each of the horizontal axes in FIGS. 10A to 10C, A represents the case of TiAlN/TiN laminated underlayer (equivalent to (d) in FIG. 9), B represents the case of TiAlN/Ti laminated underlayer (equivalent to (b) in FIG. 9), and C represents the case of TiAl underlayer (equivalent to (a) in FIG. 9). Also, D, E and F all represent the TiAlN underlayer (equivalent to (c) in FIG. 9) according to this embodiment, which is obtained by nitriding the TiAl layer. However, D represents the case where only the surface of the TiAl layer is nitride, E represents the case where about half of the TiAl layer in its depth direction is nitride, and F represents the case where most of the TiAl layer in its depth direction is nitride.

Referring to FIG. 10A, when the Al embedding is performed at room temperature, the embedding rate is improved by using the TiAlN underlayer according to this embodiment. Also, the same embedding rate as that achieved when using the TiAlN/TiN laminated underlayer is achieved even at room temperature, and complete embedding can be performed. Referring to FIG. 10B, the reflectivity is deteriorated with an increase in Al embedding temperature even when using the TiAlN underlayer according to this embodiment. However, the reflectivity can be improved compared with the case of using the TiAlN/TiN laminated under layer. In order to form an Al film with high reflectivity, it is preferable that the TiAl surface is plasma-nitrided to form a TiAlN underlayer and the film formation is performed by setting the Al embedding temperature to 250° C. or lower. Moreover, referring to FIG. 10C, the specific resistance value is deteriorated with an increase in Al embedding temperature when using the TiAlN/TiN laminated underlayer or TiAl underlayer. However, FIG. 10C also shows that the specific resistance value is constant and does not depend on the Al embedding temperature when using the TiAlN underlayer according to this embodiment.

Therefore, the TiAlN film according to this embodiment needs to be used to embed the Al film with a good embedding rate, a high reflectivity and a small specific resistance value.

Figure 11:
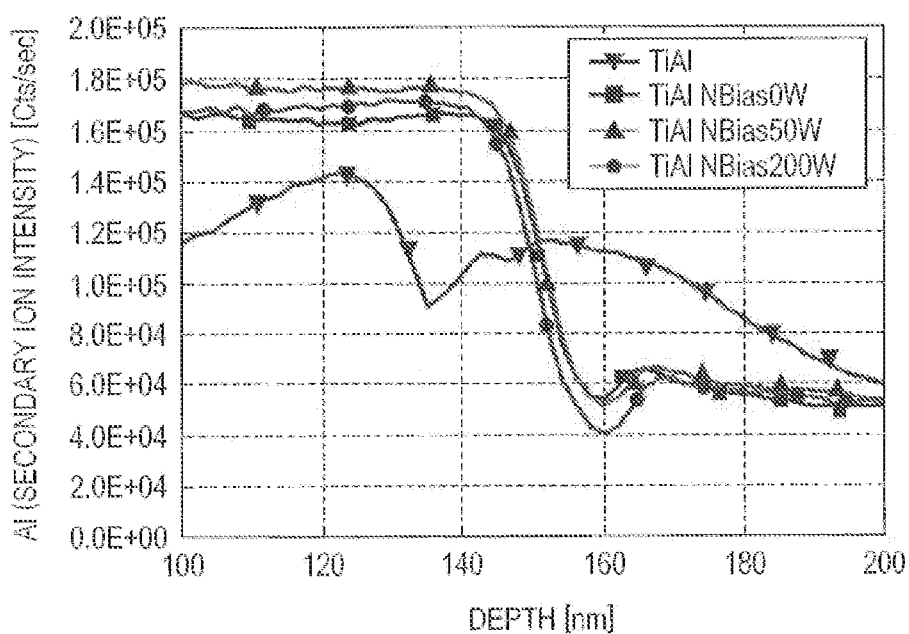
FIG. 11 is a graph showing an Al diffusion amount when plasma nitridation is performed under respective bias conditions.

Next, FIG. 11 is a graph showing a result obtained by examining, by SIMS (Secondary Ion Mass Spectroscopy), an amount of Al diffused into the TiAl layer when the titanium-aluminum nitride film formation step is performed as the second step after the TiAl film is deposited in 10 nm in the first step and then Al embedding as the third step is performed at 450° C. In FIG. 11, the vertical axis represents secondary ion intensity and the horizontal axis represents a depth from the Al surface. In FIG. 11, ▼ represents a case without plasma nitridation, ■ represents a case where plasma nitridation is performed without applying bias power (0 W) to the lower electrode 301, ▲ represents a case where plasma nitridation is performed by applying bias power of 50 W to the lower electrode 301, and ● represents a case where plasma nitridation is performed by applying bias power of 200 W to the lower electrode 301. FIG. 11 shows that Al is diffused into the TiAl layer in the TiAl layer subjected to no plasma nitridation, while Al diffusion into the TiAl layer can be suppressed by subjecting the TiAl film to the plasma nitridation of this embodiment. FIG. 11 also shows that, regardless of whether or not the bias power is applied to the lower electrode 301, Al diffusion into the TiAl layer can be suppressed by subjecting the TiAl film to the plasma nitridation of this embodiment.

Figure 12:
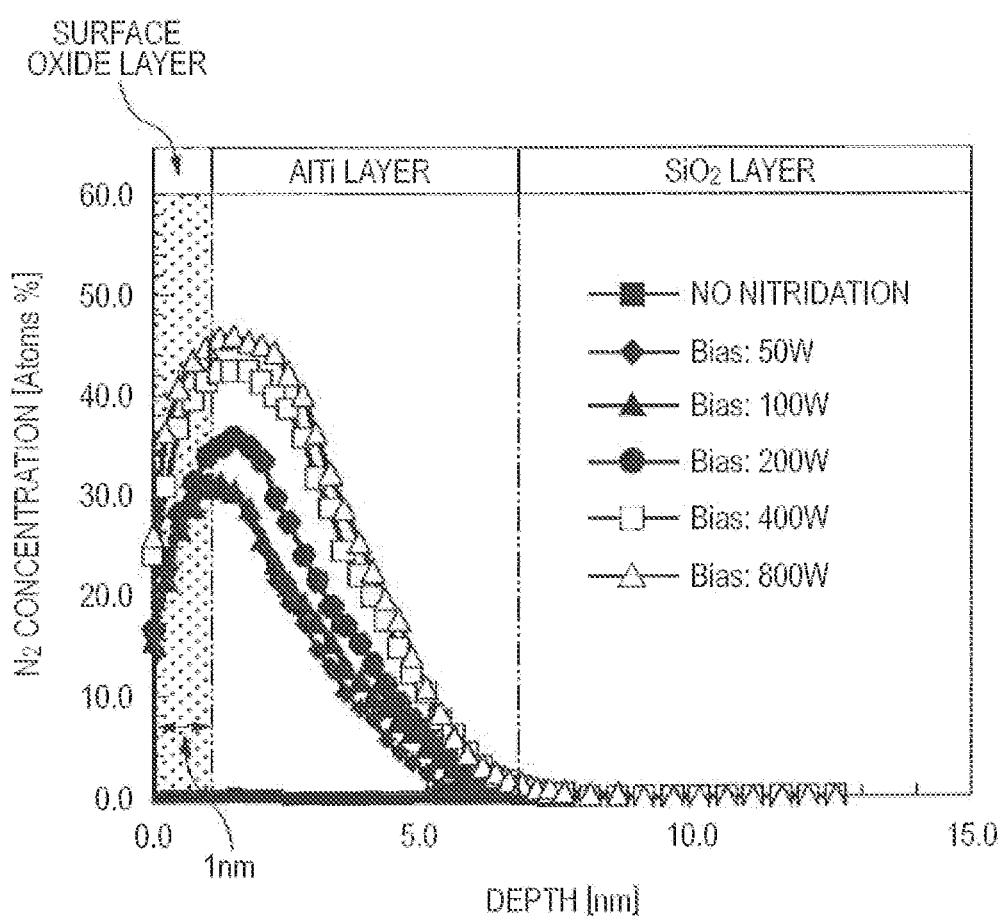
FIG. 12 is a graph showing a nitrogen concentration on TiAl when plasma nitridation is performed under respective bias conditions.

Next, FIG. 12 is a graph showing a result obtained by measuring, by XPS (X-Ray Photoelectron Spectroscopy), a nitrogen concentration in the TiAlN film in the TiAlN film formation step as the second step. In FIG. 12, the vertical axis represents a $N_2$ concentration and the horizontal axis represents a depth. Here, the depth is obtained by conversion into a rate when etching a silicon oxide film with Ar. As to the measurement direction, measurement is performed from the TiAlN film side (surface side). Here, an interface between the surface oxide layer and the TiAlN layer is defined as about 1 nm from the surface of the surface oxide layer. In FIG. 12, ■ represents a nitrogen concentration distribution without nitriding. ♦ represents a nitrogen concentration distribution when nitriding is performed with bias power of 50 W, ▲ represents a nitrogen concentration distribution when nitriding is performed with bias power of 100 W, ● represents a nitrogen concentration distribution when nitriding is performed with bias power of 200 W, □ represents a nitrogen concentration distribution when nitriding is performed with bias power of 400 W, and Δ represents a nitrogen concentration distribution when nitriding is performed with bias power of 800 W. FIG. 12 shows that the nitrogen concentration in the TiAlN film is increased with an increase in power applied to the substrate, and the TiAl film is more deeply nitrided. Furthermore, based on the fact that a Ti content is increased more than Al content with an increase in bias power, it can be speculated that the TiAlN film higher in TiN film concentration than in AlN film concentration is formed, allowing Al diffusion to be suppressed.

Figure 13:
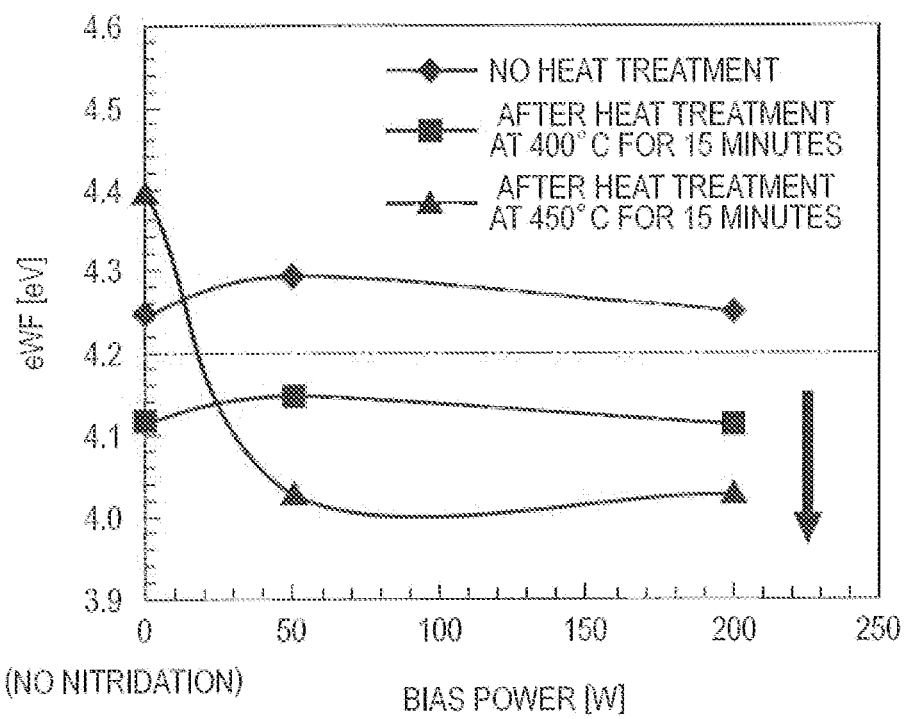
FIG. 13 is a graph showing a result of examination of an effective work function of an N-type MOSFET.

Next, FIG. 13 is a graph showing effective work function values of an element formed by using the TiAlN film formed in this embodiment and forming an Al film on the TiAlN film. In FIG. 13, the vertical axis represents an effective work function (eWF) and the horizontal axis represents a bias power during nitriding of the TiAl film. Note that FIG. 13 shows a result obtained when the TiAl film is not nitride at the point where the bias power is 0 W. In FIG. 13, ♦ represents an effective work function value obtained without heat treatment after element formation, ■ represents an effective work function value obtained when heat treatment is performed at 400° C. for 15 minutes, and Δ represents an effective work function value obtained when heat treatment is performed at 450° C. for 15 minutes. The result shows that, when the TiAlN film is used as the underlayer even after the heat treatment is performed at 450° C. for 15 minutes, an effective work function is 4.2 eV or less, which is suitable for an N-type MOSFET.

Figure 14:
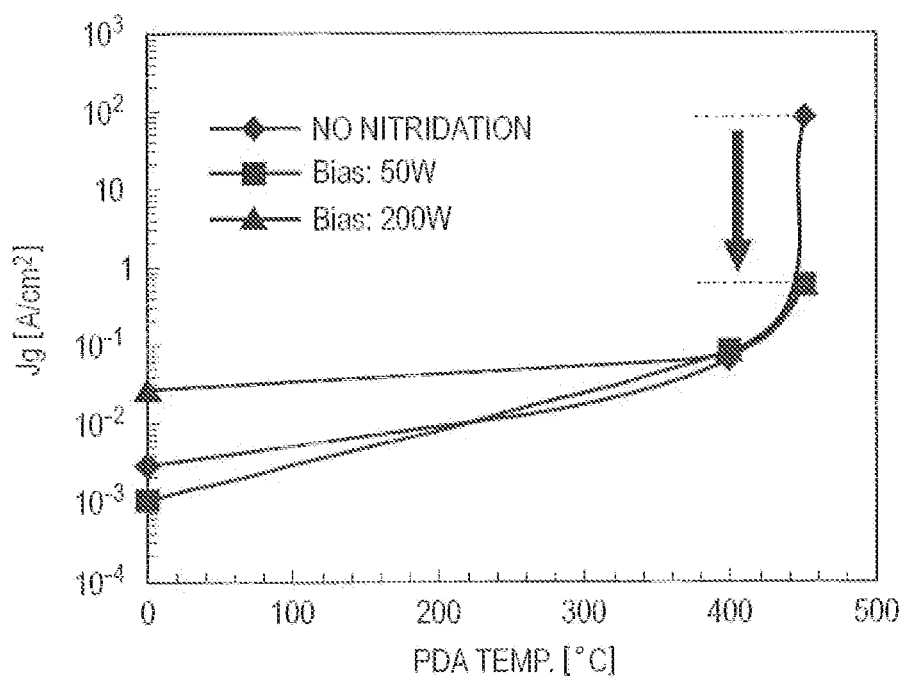
FIG. 14 is a graph showing a result of examination of a leak current in the N-type MOSFET.

FIG. 14 is a graph showing leak current characteristics of the element subjected to hear treatment after the Al film is formed on the TiAlN film formed using this embodiment. In FIG. 14, the vertical axis represents a leak current (Jg) and the horizontal axis represents a temperature during post-deposition heat treatment (PDA). In FIG. 14, ♦ represents a leak current value obtained without nitriding (i.e., when the Al film is formed on the TiAl film rather than on the TiAlN film), ■ represents a leak current value obtained when nitriding is performed with the substrate applied power of 50 W, and ▲ represents a leak current value obtained when nitriding is performed with the substrate applied power of 200 W. FIG. 14 shows that, particularly when high-temperature heat treatment is performed at 450° C. for 15 minutes, the leak current is improved in the element using the nitride TiAlN film compared with the element that is not nitride. This leads to a speculation that the use of the TiAlN film can suppress Al diffusion as shown in FIG. 11 and thus improve the leak current. The above results show that the use of a metal alloy nitride film formed using this embodiment can obtain an effective work function suitable for the N-type MOSFET and improve the leak current.

This embodiment includes the first step of forming the first electrode constituting layer (e.g., TiAl), the second step of forming a nitride layer by plasma nitriding the first electrode constituting layer, and the third step of embedding the second electrode constituting layer (e.g., Al) on the nitride layer. Thus, low resistance Al can be directly embedded smoothly without unevenness by suppressing reduction in opening diameter even on the workpiece in which minute trenches having the opening diameter of 15 nm or less are formed.

Since sputtering is used to form the first electrode constituting layer in this embodiment, an effect is achieved that an alloy composition of the first electrode constituting layer to be formed at the bottom in the recess can be easily controlled by changing to a desired target composition. For example, when the first electrode constituting layer is formed by sputtering using a TiAl alloy target, excellent TiAl alloy composition controllability is achieved. In the case of using a $Ti_{50}Al_{50}$ target, for example, a first electrode constituting layer having a $Ti_{50}Al_{50}$ composition equivalent to the target composition is formed at the bottom of the recess. Alternatively, in the case of using a $Ti_{70}Al_{30}$ target, a first electrode constituting layer having a $Ti_{70}Al_{30}$ composition as the target composition is formed at the bottom of the recess. Therefore, an effect is achieved that the TiAl alloy composition of the first electrode constituting layer can be desirably controlled by changing the TiAl target composition ratio.

In this embodiment, since the plasma treatment is used for nitriding of the first electrode constituting layer, an effect is achieved that the surface of the first electrode constituting layer formed at the bottom and sidewall of the recess in the workpiece can be nitride at low temperature. In the generally used CVD method, the nitriding is performed using gas (NH 3 or the like) for nitriding metal alloy. However, this method needs to increase the substrate temperature up to a gas decomposition reaction temperature. Thus, the need to increase the temperature of the element causes interdiffusion between the insulating film and the first electrode constituting layer. As a result, desired device characteristics cannot be achieved.

In this embodiment, the use of the magnet mechanism capable of forming a point-cusp magnetic field achieves inplane uniformity in intensity of the magnetic field formed on the target surface, and allows ion particles in the plasma to perpendicularly enter the bottom of the recess in the workpiece. As a result, an effect is achieved that the surface of the first electrode constituting layer can be evenly plasma-nitrided. Moreover, since a high-density plasma can be generated by the point-cusp magnetic field, a nitride film layer having a desired plasma nitrogen concentration can be formed in a short time. Furthermore, film formation can be performed at the bottom of the recess in the workpiece while suppressing adhesion of sputtering particles onto the sidewall of the recess in the workpiece. Since the point-cusp magnetic field is used also for embedding of the second electrode constituting layer (Al), an effect is achieved that film formation can be efficiently performed at the bottom of the recess in the workpiece, and an embedding failure rate, i.e., yield can be improved.

In this embodiment, the bias power is applied to the substrate holder during nitriding of the first electrode constituting layer. Thus, ions can be drawn to the bottom of the recess in the workpiece, and the nitriding can be evenly performed. Moreover, by increasing or reducing the bias power, the surface nitride film thickness of the first electrode constituting layer can be controlled. Thus, an effect is achieved that diffusion of the second electrode constituting layer into the lower electrode layer can be suppressed in the gate-last structure.

In this embodiment, the first electrode constituting layer is nitride in a high pressure (e.g., 1 to 200 Pa) atmosphere. Thus, ionization can be facilitated, and plasma particle energy can be suppressed. Accordingly, only the surface of the first electrode constituting layer can be plasma-nitrided. As a result, an effect is achieved that diffusion of the second electrode constituting layer into the lower electrode layer can be further suppressed.

In this embodiment, the second electrode constituting layer is formed at low temperature (room temperature to 250° C.). Thus, an effect is achieved that the second electrode constituting layer has excellent surface flatness, low specific resistance and high reflectivity.

In this embodiment, the respective steps are executed without exposure to the atmosphere. Thus, impurities can be prevented from adsorbing onto interfaces between the respective layers. As a result, an effect is achieved that a film structure having desired electrical characteristics can be formed in the gate-last device.

First Example

A first example of the present invention is described in detail with reference to the drawings. FIGS. 15D and 15E are diagrams showing a first step of forming a TiAl film in a trench structure using the PCM sputtering apparatus 100 of the present invention shown in FIGS. 1 and 6, a second step of forming a TiAlN layer on a TiAl surface layer by plasma nitridation, and then a third step of Al embedding. First, as shown in FIG. 15D, a TiAl film 905 is deposited in trench structures 901 and 902 by sputtering. A metal alloy target of TiAl is used as a target, and Ar is used as sputtering gas. Next, the TiAl film 905 is plasma-nitrided using a Ti metal target and nitrogen gas as a gas to form a nitrogen plasma, thus converting the TiAl film 905 into a TiAlN film 905. Note that although the whole TiAl film 905 is converted into the TiAlN film 905 by plasma nitridation in this example, only a part (e.g., a surface) of the TiAl film 905 may be converted. Next, as shown in FIG. 15E, an Al layer 906 is embedded on the TiAlN film 905 by sputtering. An Al metal target is used as a target, and Ar is used as sputtering gas.

A substrate temperature can be appropriately set within a range of 250° C. to 500° C., a target power can be appropriately set within a range of 100 W to 5000 W, a sputtering gas pressure can be appropriately set within a range of 1 Pa to 200 Pa, an Ar gas flow rate can be appropriately set within a range of 10 sccm to 500 sccm, and a nitrogen gas flow rate can be appropriately set within a range of 1 sccm to 100 sccm.

Specific deposition conditions in this example are described below. As for the deposition of the TiAl film 905 in the first step, a metal alloy target of TiAl is used, the substrate temperature is set to 30° C., Ti target RF power is set to 1500 W, a DC voltage is set to 430 V, Ar is used as an inactive gas, an Ar feed rate is set to 100 sccm, the pressure in the chamber is set to 10 Pa by an automatic adjuster. Moreover, in order to control the shape of films to be formed, the deposition is performed by setting the RF power to 50 W for the substrate electrode. By the above formation step, the TiAl film 905 is formed to have a film thickness of 5 nm to 10 nm. Next, as for the formation of the TiAlN film 905 by plasma-nitriding the TiAl film 905 in the second step, the plasma nitridation is performed by setting the substrate temperature to 30° C., the Ti target RF power to 3000 W, the DC voltage to 0 V, a feed rate of nitrogen as a reactive gas to 100 sccm, and the pressure in the chamber to 10 Pa by the automatic adjuster. Then, as for the deposition of the Al layer 906 in the third step, the film formation is performed by setting the substrate temperature to 400° C., the Al target RF power to 3000 W, and the DC voltage to 215 V, and also using Ar as the inactive gas and setting an Ar feed rate to 100 sccm and the pressure in the chamber to 10 Pa by the automatic adjuster. Also, in order to increase the film thickness at the bottom of the trench, the film formation is performed by setting the RF power to 200 W for the substrate electrode.

Second Example

A second example is one applied to the gate-last method. The second example of the present invention is described below with reference to the drawings. FIGS. 15A to 15F are diagrams showing steps of a method for manufacturing a semiconductor device as the second example of the present invention. In this example, in a region to form an N-type MOSFFT as a first region and a region to form a P-type MOSFET as a second region, metal gate electrodes that realize suitable effective work functions are formed by performing the first step of depositing a TiAl film, the second step of forming a TiAlN barrier layer by plasma nitridation and the third step of Al embedding in the first example.

Figure 15A:
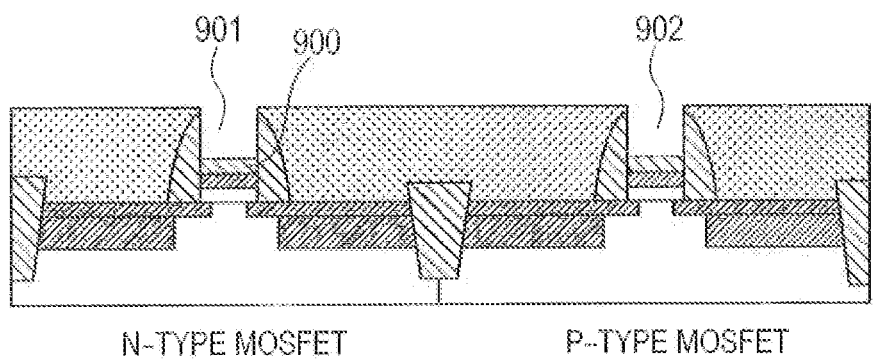
FIG. 15A is a diagram showing one of steps of an electronic component manufacturing method according to an example of the present invention.
Figure 15B:
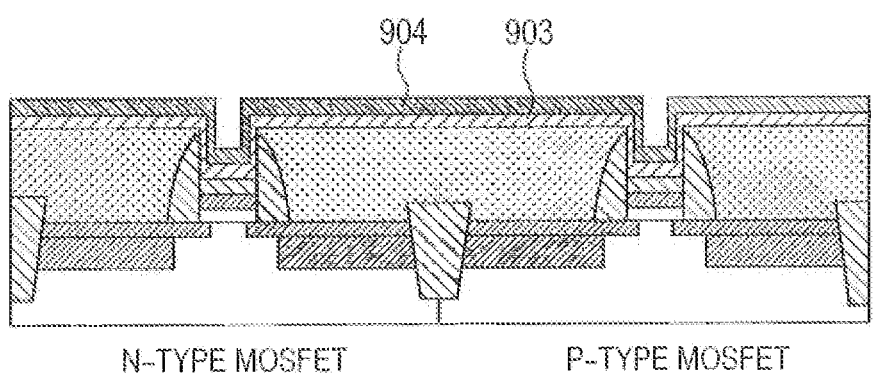
FIG. 15B is a diagram showing one of the steps of the electronic component manufacturing method according to the example of the present invention.
Figure 15C:
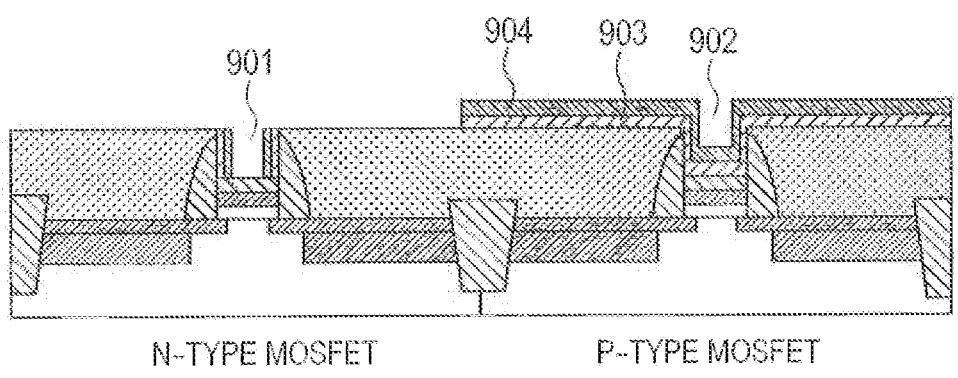
FIG. 15C is a diagram showing one of the steps of the electronic component manufacturing method according to the example of the present invention.
Figure 15D:
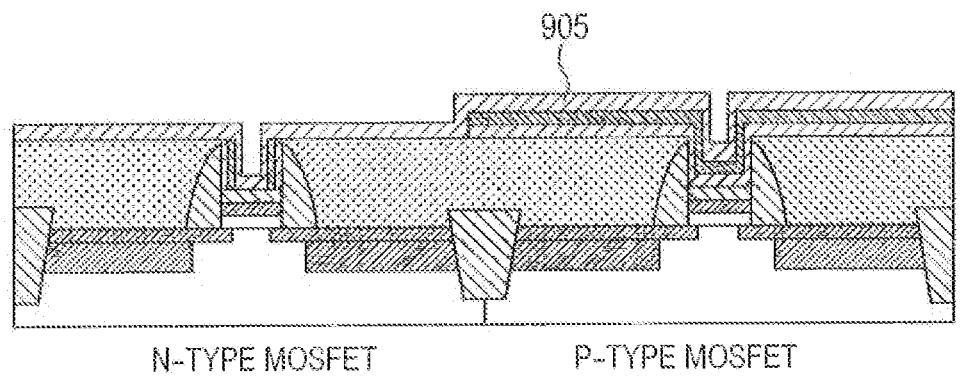
FIG. 15D is a diagram showing one of the steps of the electronic component manufacturing method according to the example of the present invention.
Figure 15E:
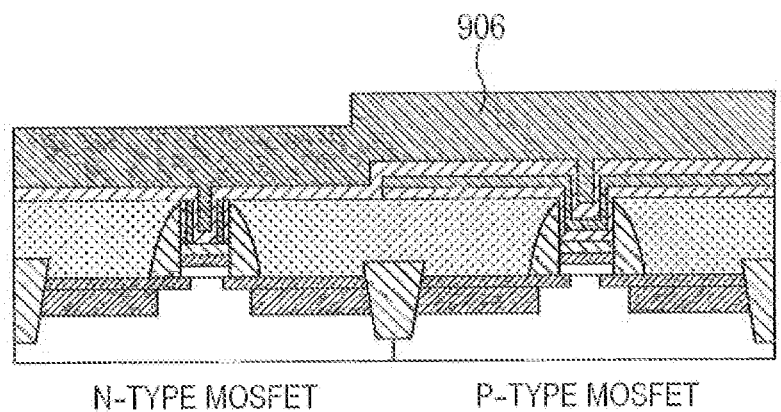
FIG. 15E is a diagram showing one of the steps of the electronic component manufacturing method according to the example of the present invention.
Figure 15F:
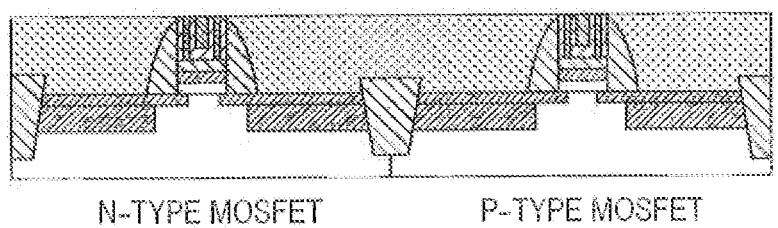
FIG. 15F is a diagram showing one of the steps of the electronic component manufacturing method according to the example of the present invention.

As shown in FIG. 15A, trench structures 901 and 902 are formed in the region to form the N-type MOSFFT and the region to form the P-type MOSFFT. Next, as shown in FIG. 15B, a metal nitride film B903 and a metal nitride film C904 are formed using the sputtering apparatus of the present invention so as to cover the insides of the trench structures. Then, as shown in FIG. 15C, the metal nitride film B903 and the metal nitride film C904 forming the bottom of the trench structure 901 in the region to form the N-type MOSFFT are removed by lithography and etching. In this example, the metal nitride film B903 is wet-etched using a mixed solution of sulfuric acid, hydrogen peroxide solution and water, and the metal nitride film C904 is removed by Ar plasma etching.

Thereafter, as shown in FIG. 15D, the substrate is transferred to a chamber 501 by the semiconductor manufacturing apparatus shown in FIG. 6 executing the sputtering method of the present invention to deposit a TiAl film in the first step that is one of the steps of the present invention, thereby forming a metal alloy film (TiAl film) 905 so as to cover the trench structure. Then, as shown in FIG. 15E, the substrate is transferred to a chamber 502 to perform the second step of plasma-nitriding the TiAl film, and the metal alloy film (TiAl film) 905 is converted into a metal alloy nitride film (TiAlN film) 905 by plasma nitridation. The substrate is further transferred to a chamber 503 to perform the third step of Al embedding, and a metal film (Al film) 906 is formed by Al embedding. Thereafter, planarization is performed using a CMP technique to form a structure shown in FIG. 15F.

It is found out that, in the trench structure 901 that is the region to form the N-type MOSFET, the metal alloy nitride film 905 is diffused in the metal nitride film 900 by setting the substrate temperature to 300° C. to 400° C. in the step of forming the Al metal film, and thus an effective work function suitable for the N-type MOSFET can be achieved. Meanwhile, it is found out that, in the trench structure 902 that is the region to form the P-type MOSFET, an effective work function suitable for the P-type MOSFET can be maintained since the metal nitride film B903 and the metal nitride film C904 suppress Al diffusion, and thus an effective work function, required for a gate-last process can be achieved. Furthermore, wiring failure is expected to be improved compared with the conventional technique. This shows that the TiAlN barrier film formed by using the apparatus of the present invention has good barrier properties against Al diffusion. As a result of measuring the effective work function, EOT and leak current characteristics of the device manufactured, it is confirmed that the use of the Al embedding method of the present invention can achieve effective work functions (4.4 eV or less in the N-type MOSFET and 4.6 eV or more in the P-type MOSFET) suitable for the respective MOSFETs without increasing the EOT.

The invention claimed is:

1. An electronic component manufacturing method, comprising:
    forming a first electrode constituting layer in a recess formed in a workpiece, the recess having an opening diameter of 15 nm or less;
    performing plasma nitridation directly on a surface of the first electrode constituting layer; and
    forming a second electrode constituting layer free of Ti directly contacting the first electrode constituting layer, which has been subjected to the plasma nitridation,
    wherein in the forming of the first electrode constituting layer, the first electrode constituting layer is formed by sputtering while a magnetic field is formed on a target surface by a magnet unit having a plurality of magnets disposed at grid points of a polygonal grid arranged in a grid, the magnets being disposed such that adjacent magnets have opposite poles,
    wherein the plasma nitridation is performed while a magnetic field is formed on the target surface by the magnet unit, and
    wherein in the forming of the second electrode constituting layer, the second electrode constituting layer having a flat surface is formed by sputtering while a magnetic field is formed on the target surface by the magnet unit.

2. The electronic component manufacturing method according to claim 1, wherein the plasma nitridation is performed in an atmosphere of 1 Pa to 200 Pa.

3. The electronic component manufacturing method according to claim 1, further comprising:
    forming a gate insulating film between the workpiece and the first electrode constituting layer before the forming of the first electrode constituting layer.

4. The electronic component manufacturing method according to claim 3, further comprising:
    forming a third electrode constituting layer between the first electrode constituting layer and the gate insulating film after the forming of the gate insulating film and before the forming of the first electrode constituting layer.

5. The electronic component manufacturing method according to claim 4, wherein the third electrode constituting layer is a layer to control an operating voltage of the electronic component.

6. The electronic component manufacturing method according to claim 1, wherein the first electrode constituting layer contains Ti and Al, and the second electrode constituting layer contains Al.

7. The electronic component manufacturing method according to claim 1, wherein the forming of the first electrode constituting layer to the forming of the second electrode constituting layer are executed without exposing the workpiece to an atmosphere.

8. The electronic component manufacturing method according to claim 1, wherein in the forming of the first electrode constituting layer, deposition is performed on a bottom of the recess by forming plasma with high density and high ionization rate.

9. The electronic component manufacturing method according to claim 1, wherein in the plasma nitridation, a nitride whose thickness is ultrathin is formed by forming plasma having a suppressed energy.

10. The electronic component manufacturing method according to claim 9, wherein in the plasma nitridation, the plasma having the suppressed energy is formed by reducing a voltage applied to the target to a voltage lower than that in the forming of the first electrode constituting layer.

11. The electronic component manufacturing method according to claim 1, wherein in the forming of the second electrode constituting layer, the second electrode constituting layer having a flat surface is formed by setting the workpiece at a low temperature.

12. The electronic component manufacturing method according to claim 11, wherein the low temperature is from room temperature to 250° C.

13. The electronic component manufacturing method according to claim 1, wherein in the plasma nitridation, a nitride formed directly on the first electrode constituting layer functions as a barrier to suppress diffusion from the second electrode constituting layer.

14. The electronic component manufacturing method according to claim 1, wherein the second electrode constituting layer is formed under a temperature condition at which the second electrode constituting layer does not flow.

15. The electronic component manufacturing method according to claim 1, wherein the second electrode constituting layer includes a low-melting point metal.

16. An electrode structure formed by an electronic component manufacturing method comprising:
- forming a first electrode constituting layer in a recess formed in a workplace, the recess having an opening diameter of 15 nm or less;
- performing plasma nitridation directly on the surface of the first electrode constituting layer; and
- forming a second electrode constituting layer free of Ti directly contacting the first electrode constituting layer, which has been subjected to plasma nitridation,
- wherein the first electrode constituting layer is a layer formed by sputtering while a magnetic field is formed on a target surface by a magnet unit having a plurality of magnets disposed at grid points of a polygonal grid arranged in a grid, the magnets being disposed such that adjacent magnets have opposite poles,
- wherein the plasma nitridation is performed while a magnetic field is formed on the target surface by the magnet unit, and
- wherein the second electrode constituting layer is a layer having a flat surface formed by sputtering while a magnetic field is formed on the target surface by the magnet unit.

* * * * *